(12) United States Patent
Choi et al.

(10) Patent No.: US 10,719,682 B2
(45) Date of Patent: *Jul. 21, 2020

(54) FINGERPRINT SENSING DISPLAY APPARATUS

(71) Applicant: LG Display Co., Ltd., Seoul (KR)

(72) Inventors: SungPil Choi, Seoul (KR); NamYong Gong, Paju-si (KR); JinYeol Kim, Sangju-si (KR); YoungSoo Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 95 days.

This patent is subject to a terminal disclaimer.

(21) Appl. No.: 16/103,201

(22) Filed: Aug. 14, 2018

(65) Prior Publication Data

US 2019/0197281 A1    Jun. 27, 2019

(30) Foreign Application Priority Data

Dec. 27, 2017   (KR) .......................... 10-2017-0180927

(51) Int. Cl.
*G06K 9/20* (2006.01)
*G06K 9/00* (2006.01)
(Continued)

(52) U.S. Cl.
CPC .......... *G06K 9/0002* (2013.01); *B06B 1/0692* (2013.01); *G06F 3/0412* (2013.01); *G06K 9/209* (2013.01); *H01L 27/323* (2013.01); *H01L 27/3234* (2013.01); *H01L 27/3272* (2013.01); *H01L 51/0097* (2013.01);
(Continued)

(58) Field of Classification Search
CPC .......... G06K 9/00006–9/0012; G06K 9/0002; G06K 9/209; H01L 27/3272; H01L 51/5281; H01L 27/323; H01L 27/3234; H01L 27/3244; H01L 51/0097; H01L 51/52; H01L 51/529; H01L 2251/5338; B06B 1/0692; G06F 1/1643; G06F 1/1684; G06F 1/1696; G06F 3/0412; H04R 1/028; H04R 17/00; H04R 2499/15
See application file for complete search history.

(56) References Cited

U.S. PATENT DOCUMENTS

| | | | |
|---|---|---|---|
| 2014/0355376 A1 | 12/2014 | Schneider et al. | |
| 2018/0069068 A1* | 3/2018 | Ka | G06K 9/00013 |
| 2018/0373913 A1* | 12/2018 | Panchawagh | G06K 9/0002 |

OTHER PUBLICATIONS

PET; Designerdata, downloaded from https://www.designerdata.nl/plastics/thermo+plastics/PET on Jan. 14, 2020, pp. 1-3. (Year: 2020).*

(Continued)

*Primary Examiner* — Brian Werner
(74) *Attorney, Agent, or Firm* — Fenwick & West LLP

(57) ABSTRACT

Disclosed is a display device. The display device comprises an electroluminescence display panel including a fingerprint recognition area in a display area including a plurality of pixels on a substrate, an ultrasonic fingerprint sensor, under a rear side of the electroluminescence display panel, arranged corresponding to the fingerprint recognition area, and a support substrate, between the electroluminescence display panel and the ultrasonic fingerprint sensor, configured to support the electroluminescence display panel and the ultrasonic fingerprint sensor.

24 Claims, 30 Drawing Sheets

(51) Int. Cl.
*H01L 27/32* (2006.01)
*H01L 51/00* (2006.01)
*H01L 51/52* (2006.01)
*B06B 1/06* (2006.01)
*G06F 3/041* (2006.01)
*H04R 1/02* (2006.01)
*H04R 17/00* (2006.01)

(52) U.S. Cl.
CPC .......... *H01L 51/52* (2013.01); *H01L 51/5281* (2013.01); *H01L 27/3244* (2013.01); *H01L 51/529* (2013.01); *H01L 2251/5338* (2013.01); *H04R 1/028* (2013.01); *H04R 17/00* (2013.01); *H04R 2499/15* (2013.01)

(56) References Cited

OTHER PUBLICATIONS

European Patent Office, Extended European Search Report and Opinion, EP Patent Application No. 18194613.8, dated Feb. 12, 2019, 15 pages.

\* cited by examiner

FINGERPRINT SENSING DISPLAY APPARATUS

CROSS-REFERENCE TO RELATED APPLICATIONS

This application claims the priority of Republic of Korea Patent Application No. 10-2017-0180927 filed on Dec. 27, 2017, in the Korean Intellectual Property Office, the disclosure of which is incorporated by reference in its entirety.

BACKGROUND

Technical Field

The present disclosure relates to a display device capable of fingerprint recognition. Specifically, the display device is capable of recognizing a fingerprint using an ultrasonic technique by placing an ultrasonic fingerprint sensor under the rear surface of an electroluminescence display panel such that the electroluminescence display panel becomes a transmission and reception channel of the ultrasonic signal.

Related Technology

Referring to FIG. 1, a conventional fingerprint sensor 14 is attached to the periphery of the liquid crystal display panel 11 of the conventional display device 10 to support a fingerprint recognition function. The conventional display device 10 includes a liquid crystal display panel 11, a fingerprint sensor 14 disposed around the liquid crystal display panel 11 so as to be exposed to the environment, a first speaker 12 and a second speaker 13. It has been difficult to make the conventional display device 10 with a narrow bezel due to the fingerprint sensor 14 and the speakers 12 and 13. Therefore, it has been difficult to increase the display area ratio of the display panel 11 of the display device 10.

SUMMARY

The present disclosure describes an electroluminescence display panel capable of displaying a superior image quality. The electroluminescence display panel includes an electroluminescence element.

In particular, an ultrasonic sensor is disposed under the rear surface of the electroluminescence display panel. The electroluminescence display panel may include an organic light emitting diode (OLED) and/or a quantum-dot light emitting diode (QLED).

By placing a fingerprint sensor under the rear surface of an electroluminescence display panel, a fingerprint recognition function can be provided by touching a user finger on a display area or a cover glass on a display area through an electroluminescence display panel. Further, in such case, a width of the bezel of the display device including the electroluminescence display panel can be minimized, thereby maximizing the area of the electroluminescence display panel of the display device.

Further, an ultrasonic signal can be used for recognizing a fingerprint through an electroluminescence display panel, and sensitivity of the ultrasonic signal may be reduced for various reasons. In addition, when the sensitivity of the ultrasonic signal reduced, the recognition success rate may be lowered, and the fingerprint recognition speed may be lowered, so that the user may experience a slow response speed.

In order to perform fingerprint recognition through an electroluminescence display panel, the frequency of the ultrasonic signal of the fingerprint sensor may be at least 10 MHz and if the frequency of the ultrasonic signal is in such a high frequency band, the sensitivity of the ultrasonic signal can be reduced according to the density or the Young's Modulus of the respective elements, and/or thickness of the respective elements.

An image quality of the electroluminescence display panel and/or the sensitivity of the fingerprint sensor may be degraded due to electromagnetic interference (EMI) generated between the fingerprint sensor and the electroluminescence display panel.

When the fingerprint sensor is attached to the electroluminescence display panel, the flatness of the substrate of the electroluminescence display panel may be deteriorated by the stress applied to the substrate of the electroluminescence display panel by the fingerprint sensor. Accordingly, a pressed mark of the electroluminescence display panel may be visible.

When the fingerprint sensor is disposed on the rear surface of the electroluminescence display panel, the light-shielding level at the rear surface of the electroluminescence display panel may vary according to the fingerprint sensor arrangement. Thus, the characteristics of the display panel may be varied accordingly. Therefore, a stain defect, for example, a shadow-mura may occur.

When the fingerprint sensor is disposed on the rear surface of the electroluminescence display panel, the heat radiation characteristic of the rear surface of the electroluminescence display panel may vary according to the arrangement of the fingerprint sensor and an image retention may be generated in a displayed image due to the temperature deviation of the electroluminescence display panel.

Accordingly, it is an object of the present disclosure to provide a structure of a display device capable of improving above-mentioned problems, in which an ultrasonic fingerprint sensor disposed on the rear surface of an electroluminescence display panel.

Accordingly, an object of the present disclosure is to provide a structure of a display device capable of overcoming the above-mentioned problems and improving various problems that may degrade the image quality of the electroluminescence display panel, thereby improving the sensitivity of the ultrasonic sensor signal and improving the speed of fingerprint recognition.

It should be noted that the objects of the present disclosure are not limited to those described above and other objects of the present disclosure included in the following descriptions can be clearly understood by those skilled in the art from the following description.

In one embodiment, a display device comprises: an electroluminescence display panel, the electroluminescence display panel including a display area and a fingerprint recognition area in the display area, the display area including a plurality of pixels; an ultrasonic fingerprint sensor under the electroluminescence display panel, the ultrasonic fingerprint sensor overlapping the fingerprint recognition area of the electroluminescence display panel; and a support substrate between the electroluminescence display panel and the ultrasonic fingerprint sensor, the support substrate configured to support the electroluminescence display panel and the ultrasonic fingerprint sensor.

In one embodiment, a display device comprises: an electroluminescence display panel; a fingerprint sensor disposed under the electroluminescence display panel; and a light-shield support substrate between the electroluminescence display panel and the fingerprint sensor, the light-shield support substrate configured to absorb external light that is transmitted through the electroluminescence display panel and reflected by the fingerprint sensor.

In one embodiment, a display device includes: an electroluminescence display panel comprising a plurality of pixels on a flexible substrate, the flexible substrate having a Young's modulus in a range from 1.5 GPa to 3 GPa; an ultrasonic fingerprint sensor under the electroluminescence display panel; a cured adhesive member that bonds the ultrasonic fingerprint sensor to the electroluminescence display panel; and a light-shield support substrate positioned between the electroluminescence display panel and the ultrasonic fingerprint sensor, the light-shield support substrate configured to absorb at least a portion of external light that passes through the electroluminescence display panel and configured to reduce a flatness degradation of the electroluminescence display panel due to a stress exerted by the cured adhesive member that bonds the ultrasonic fingerprint sensor to the electroluminescence display panel.

It should be noted that the effects of the present disclosure are not limited to those described above and other effects of the present disclosure are included in the following descriptions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
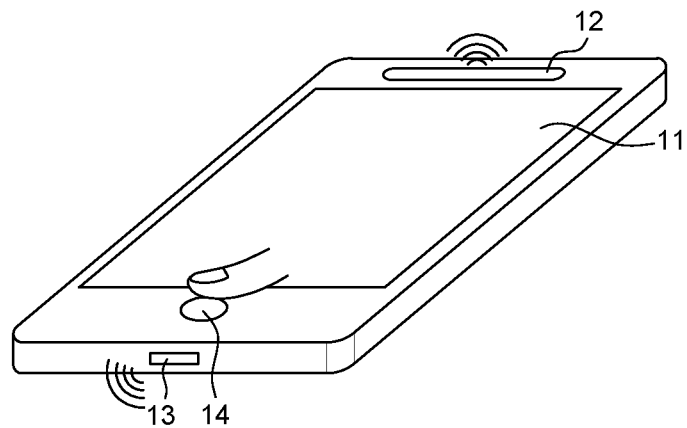
FIG. 1 explains a conventional display device.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including", "having" and "consist of" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two parts is described using the terms such as "on", "above", "below", and "next", one or more parts may be positioned between the two parts unless the terms are used with the term "immediately" or "directly".

When an element or layer is disposed "on" other element or layer, another layer or another element may be interposed directly on the other element or therebetween.

If it is described that a component is "connected" or "coupled" to another component, it is understood that the component is directly connected or coupled to the other component but another component may be "connected" or "coupled" between the components.

Although the terms "first", "second" and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

A size and a thickness of each component illustrated in the drawing are illustrated for convenience of description, and the present disclosure is not limited to the size and the thickness of the component illustrated.

Each of the features of the various embodiments of the present disclosure can be combined or combined with each other partly or entirely. Those skilled in the art will understand that the features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

Figure 2:
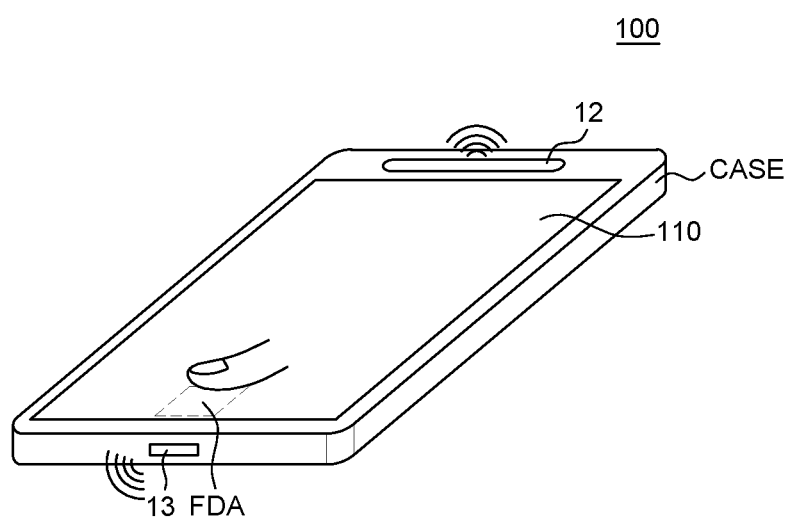
FIG. 2 is a conceptual diagram schematically illustrating a display device capable of providing a fingerprint recognition function according to an embodiment of the present disclosure.

FIG. 2 is a conceptual diagram schematically illustrating a display device capable of providing a fingerprint recognition function according to an embodiment of the present disclosure.

Referring to FIG. 2, a display device 100 according to an embodiment of the present disclosure will be described.

The display device 100 according to an embodiment of the present disclosure may include an electroluminescence display panel 110 and a case supporting the electroluminescence display panel 110.

Various components may be placed inside the case of the display device 100. For example, speakers 12, 13, a battery, a printed circuit board, an antenna, a sensor, and/or a camera may be disposed. However, the present disclosure is not limited thereto.

The electroluminescence display panel 110 is configured to include a fingerprint recognition area (FDA) configured to recognize or to detect a fingerprint of a finger that is touched when a user's finger touches a specific area of the electroluminescence display panel 110. Accordingly, the display device 100 according to an embodiment of the present disclosure can recognize a fingerprint by inputting a touch to the electroluminescence display panel 110. Thus, the fingerprint recognition area FDA may refer to a particular area of the electroluminescence display panel 110 configured to detect the fingerprint. According to the embodiments of the disclosure, the fingerprint recognition area FDA may be realized at one or a plurality of different positions of the electroluminescence display panel 110 as well as the area corresponding to the home button as illustrated in FIG. 1.

Therefore, the display device 100 (i.e., the apparatus) can detect the fingerprint through the electroluminescence display panel 110 and may provide various security functions. Since a separate fingerprint sensor can be omitted from the bezel area of the display device 100, the display area ratio of the electroluminescence display panel 110 in the display device 100 can be maximized.

For convenience of explanation, the ultrasonic fingerprint sensor of the ultrasonic type will be referred to as a fingerprint sensor.

Various user interfaces (UI) corresponding to the fingerprint recognition operation may be displayed in the fingerprint recognition area FDA through a plurality of pixels.

For example, for a short message service (SMS) reception notification window, the fingerprint recognition function may be activated such that a fingerprint recognition position may be displayed for a user and a guidance message for finger contact may be displayed. The fingerprint recognition process can be performed to support various user authentication functions, and it can be applied to functions such as security access, online payment, and user registration. If a plurality of fingerprint sensors is placed at various positions of the electroluminescence display panel 110, different functions may be provided for each fingerprint recognition position.

Figure 3:
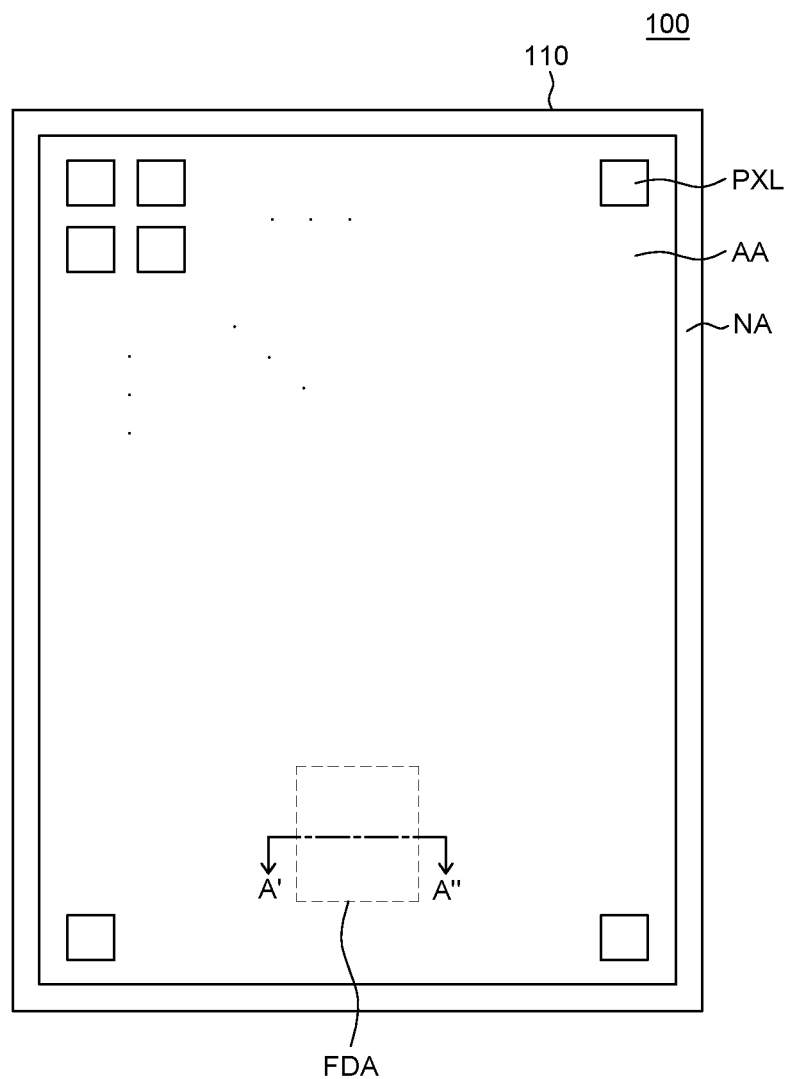
FIG. 3 is a plan view schematically illustrating an electroluminescence display panel of a display device capable of providing a fingerprint recognition function according to an embodiment of the present disclosure.

FIG. 3 is a plan view schematically illustrating an electroluminescence display panel of a display device capable of providing a fingerprint recognition function according to an embodiment of the present disclosure.

Referring to FIG. 3, an electroluminescence display panel 110 of the display device 100 according to an embodiment of the present disclosure will be described.

The electroluminescence display panel 110 according to an embodiment of the present invention may be configured to include a plurality of pixels PXL. The region where the plurality of pixels PXL is arranged may be defined as a display area AA. The area other than the display area AA or the peripheral area of the display area AA may be defined as the non-display area NA.

In the non-display area NA, a driving unit for driving the plurality of pixels PXL is disposed. The driving unit may include a gate driver for supplying a scan signal to the switching transistor of the pixel PXL and a data driver for supplying a video signal to the data line.

The pixel PXL of the electroluminescence display panel 110 may include an electroluminescence element that displays a specific color. For example, the pixel PXL may be configured to include red, green, and blue electroluminescence elements, or may be configured to include red, green, blue, and white electroluminescence elements, or may be configured to include red, green, blue, and green electroluminescence elements.

The pixel PXL may include at least a switching transistor, a driving transistor, and a storage capacitor.

The switching transistor is turned on when a scan signal is supplied to the scan line, and supplies the data signal supplied to the data line to the gate electrode of the driving transistor and the storage capacitor.

The driving transistor controls the current supplied to the electroluminescence element according to the data signal, which is a video signal supplied to the gate electrode of the driving transistor, and a high potential voltage supplied from a high potential power supply line, thereby controlling the brightness of light emitted from the electroluminescence element. Even if the switching transistor is turned off, the driving transistor may supply the current until the data signal of the next frame is supplied by the potential difference charged in the storage capacitor, so that the electroluminescence element may maintain the light emission. The electroluminescence element may be an electroluminescence diode, and the electroluminescence diode may include an anode electrode, an electroluminescence layer corresponding to the anode electrode, and a cathode electrode corresponding to the electroluminescence layer. The cathode electrode may be configured to receive a low potential voltage from a low potential power supply line.

Ultrasonic waves generated from the fingerprint sensor are transmitted to the fingerprint recognition area FDA set in the display area AA. The fingerprint sensor may be configured to detect a fingerprint by sensing ultrasonic waves reflected from the finger.

Figure 4:
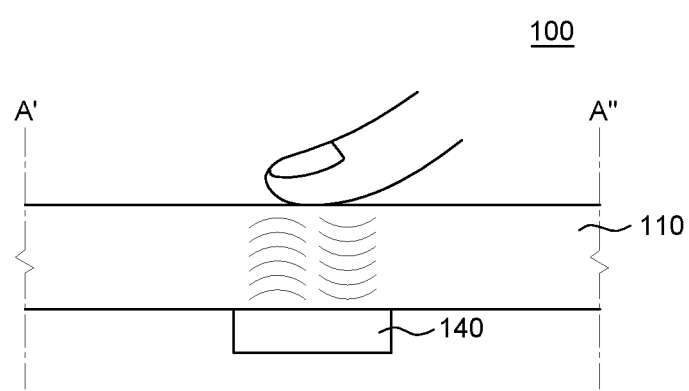
FIG. 4 is a cross-sectional view schematically illustrating a cross section A'-A" of the display device as illustrated in FIG. 3 according to an embodiment of the present disclosure.

FIG. 4 is a cross-sectional view schematically illustrating a cross section A'-A" of the display device as illustrated in FIG. 3.

Referring to FIG. 4, the electroluminescence display panel 110 and the fingerprint sensor 140 of the display device 100 according to an embodiment of the present disclosure will be described.

A fingerprint sensor 140 is positioned under the rear side of the electroluminescence display panel 110 of the display device 100 according to an embodiment of the present disclosure.

The fingerprint sensor 140 may be used for approval function, through the display area AA by the ultrasonic wave technique, for the user. The fingerprint sensor 140 may generate ultrasonic waves and the generated ultrasonic waves may be transmitted toward the electroluminescence display panel 110. The fingerprint sensor 140 may be configured to detect the ultrasonic waves transmitted through the electroluminescence display panel 110, reflected by the finger, and then received by the fingerprint sensor 140 through the electroluminescence display panel 110. The fingerprint sensor 140 may be configured to analyze a sensed ultrasonic signal to generate an ultrasonic image to determine a fingerprint.

The characteristics of ultrasonic waves for fingerprint recognition used in the fingerprint sensor 140 of the display device 100 according to an embodiment of the present disclosure will be described.

In the case of ultrasonic waves, as the frequency increases, the degree of signal attenuation increases rapidly in low-density materials. Therefore, as the frequency increases, the density of the transmission and reception channel of the ultrasonic wave greatly affects the quality of the ultrasonic signal. To improve the quality of the ultrasonic signal, in one embodiment, the Young's modulus of the corresponding mediums between a user's finger and the fingerprint sensor 140 within the transmission and reception channel have matching acoustic impedance characteristics. When an ultrasonic signal is emitted toward stacked mediums with matching acoustic impedances, there is less ultrasonic signal reflection at the interface of different mediums compared to when the stacked mediums have mismatched acoustic impedances. That is, when the ultrasonic waves enter from one medium into another medium and the acoustic impedances between the two mediums match, a reflectance of the ultrasonic waves at a boundary between the mediums is reduced. Accordingly, a transmittance of the ultrasonic waves to a next medium is increased.

In the case of an ultrasonic image for fingerprint recognition, the resolution of the ultrasonic image increases as the frequency increases. Ultrasonic fingerprint recognition technology requires a level of ultrasonic image resolution that can detect the fingerprint valley.

The fingerprint sensor 140 disposed under the rear surface of the electroluminescence display panel 110 of the display device 100 according to an embodiment of the present disclosure may be configured to receive and transmit a frequency of at least 10 MHz or more to recognize a fingerprint. According to the above-described configuration, the fingerprint can be recognized by using the electroluminescence display panel 110 as a channel for ultrasonic transmission and reception.

The fingerprint sensor 140 disposed under the rear surface of the electroluminescence display panel 110 of the display device 100 according to an embodiment of the present disclosure may be configured to receive and transmit a frequency of 15 MHz or less to recognize a fingerprint. If a frequency of 15 MHz or more is used, the level of ultrasonic wave signal attenuation can be significant, and signal sensitivity may be reduced when the electroluminescence display panel is used as a transmission and reception channel.

Figure 5:
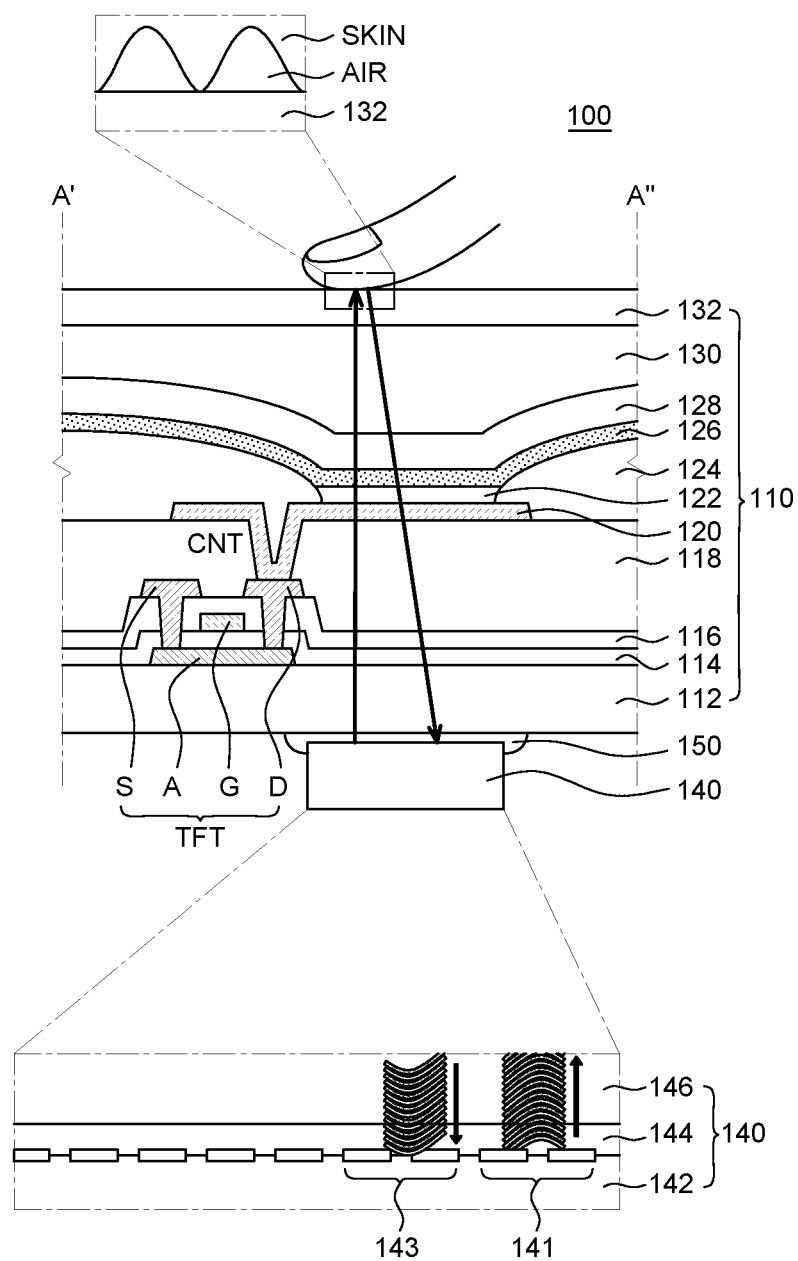
FIG. 5 is a cross-sectional view illustrating a stack structure of an exemplary electroluminescence display panel which can be applied to a cross-section A'-A" of a display device schematically illustrated in FIG. 4 according to an embodiment of the present disclosure.

FIG. 5 is a cross-sectional view illustrating a stack structure of an exemplary electroluminescence display panel which can be applied to a cross-section A'-A" of a display device schematically illustrated in FIG. 4.

Referring to FIG. 5, an electroluminescence display panel 110 according to an embodiment of the present disclosure will be described. The electroluminescence display panel 110 as illustrated in FIG. 5 is merely an example, and various modifications with respect to the stacking structure, stacking order, thickness, and density of each element of the electroluminescence display panel 110 may be made without departing from the technical scope of the present disclosure.

The display device 100 according to an embodiment of the present disclosure may be configured to include an electroluminescence display panel 110 and a fingerprint sensor 140 under the rear side of the electroluminescence display panel 110.

The fingerprint sensor 140 may generate ultrasonic waves. The ultrasonic waves generated by the fingerprint sensor 140 may pass through the electroluminescence display panel 110 and may detect the density difference of the air portion within the fingerprint valley and the skin of the fingerprint. As an example, the fingerprint sensor 140 may be configured to include a sensor substrate 142, transmitting (Tx) electrodes 141 and receiving (Rx) electrodes 143 on the sensor substrate 142, a Tx/Rx layer 144 on the Tx electrodes 141 and Rx electrodes 143, and a cover substrate 146 on the Tx/Rx layer 144. However, the present disclosure is not limited thereto.

Generally, the fingerprint sensor 140 obtains an image of a fingerprint by measuring the difference in density between fingerprint ridges (skin) and fingerprint valleys (air). Specifically, the Tx electrodes 141 may be configured to output ultrasonic waves to a finger, and the Rx electrodes 143 may be configured to sense ultrasonic waves reflected from the finger. Accordingly, the fingerprint sensor 140 may be defined as an electrode structure configured to transmit and receive ultrasonic waves. An advantage of using ultrasonic technology to measure a fingerprint is the ability to penetrate through thicker layers of glass and transparent plastic as well as image through metal and opaque glass or plastic layers. Other advantages of using ultrasonic technology include higher resolution (in the range of 500-2000 PPI), the potential for scanning the internal structure of a finger (e.g., capillaries) which would make it extremely difficult to spoof, being able to determine heart rate, and an improved ability to cope with sweaty and dirty fingers.

The above-described functions of the fingerprint sensor 140 may be implemented by a control unit. That is, the control unit of the fingerprint sensor 140 can recognize a fingerprint of a user by processing ultrasonic waves transmitted and received from the Tx electrodes 141 and the Rx electrodes 143.

The electroluminescence display panel 110 may be configured to include at least the substrate 112, the transistor TFT, the electroluminescence element 122, and the encapsulation unit 128, 130, 132.

The substrate 112 may be made of rigid glass. The substrate 112 supports various elements of the electroluminescence display panel 110. On the substrate 112, a transistor TFT is disposed. The transistor TFT as illustrated in FIG. 5 as an example may correspond to the structure of the switching transistor and the driving transistor of the pixel PXL, which is exemplarily described.

The transistor TFT may be configured to include a semiconductor layer A, a first insulating layer 114 configured to insulate the semiconductor layer A from a gate electrode G, the gate electrode G configured to overlap with the semiconductor layer A on the first insulating layer 114, a second insulating layer 116 configured to insulate the gate electrode G, the source electrode S and the drain electrode D, and a source electrode S and a drain electrode D configured to be electrically connected to the semiconductor layer A through the contact hole on the second insulating layer 116. The above-described transistor TFT structure may be referred to as a transistor of a co-planar structure.

The first insulating layer 114 and the second insulating layer 116 may be formed of an inorganic insulating material such as silicon nitride (SiNx), silicon oxide (SiOx), or silicon oxynitride (SiON).

However, the transistor according to the embodiments of the present disclosure is not limited thereto and may be implemented by transistors having various structures. For example, the transistor may be configured as an inverted staggered structure.

The third insulating layer 118 may be formed on the transistor TFT to flatten the upper portion of the transistor TFT. The anode 120 and the transistor TFT may be electrically connected to each other through the contact hole CNT formed in the third insulating layer 118. The third insulating layer 118 may be made of an organic material having a planarizing property for planarization. For example, photoacrylic or polyimide may be used as the organic material.

An electroluminescence element 122 is disposed on the anode 120 and a cathode 126 is disposed on the electroluminescence element 122.

The anode 120 may be connected to a transistor TFT to receive current. The anode 120 is electrically connected to the drain electrode D of the transistor TFT through a contact hole passing through the third insulating layer 118. The electroluminescence element 122 is disposed on the anode 120 surrounded by a bank 124. A spacer may be disposed on some portions of the bank 124. The spacer may be formed in such a way that the height of a portion of the bank 124 is made higher through a halftone exposure technique.

The electroluminescence element 122 may be disposed in the light emitting region of the pixel. The electroluminescence element 122 may have a single-layered structure or a multi-layered structure. For example, the electroluminescence element 122 may further include a hole-transporting layer, an electron-transporting layer, and the like. The electroluminescence element 122 may include a light emitting material corresponding to a particular color of a pixel to display the particular color of each pixel.

In the case of an organic light emitting diode, the electroluminescence element 122 may be formed of an organic material.

In the case of an inorganic light emitting diode, the electroluminescence element 122 may be made of an inorganic material. For example, when an inorganic light-emitting diode is formed using a quantum-dot material, it may be referred to as a quantum-dot light emitting diode.

The electroluminescence elements 122 may be formed individually according to the intrinsic color of each pixel. However, the present disclosure is not limited thereto, and when all the pixels have a white color, the electroluminescence layer may be formed as a common layer. The common layer may refer to a layer formed in all areas of the display area AA.

The hole-transporting layer and/or the electron-transporting layer may provide a function of facilitating the movement of holes and electrons in the electroluminescence layer. The hole-transporting layer and/or the electron-transporting layer may be formed as a common layer. However, the present disclosure is not limited thereto, and the hole-transporting layer and/or the electron-transporting layer may be selectively applied to improve the characteristics of each pixel. In such case, the hole-transporting layer and/or the electron-transporting layer may be formed in a particular region of the display area AA. In addition, it is possible to have different thicknesses of the electroluminescence layer depending on the pixel.

The cathode 126 is formed to face the anode 120 with the electroluminescence element 122 therebetween. When the cathode 126 is formed in such a manner as to cover the display area AA, the cathode 126 may be referred to as a common electrode.

The encapsulation unit 128, 130, 132 may be configured to suppress moisture or oxygen from penetrating into the electroluminescence element 122, which may be vulnerable to moisture or oxygen. The encapsulation unit 128, 130, 132 may be formed to protect the electroluminescence element 122 in particular, since the electroluminescence element 122 may be particularly vulnerable to moisture and oxygen when the electroluminescence element 122 includes an organic material. For this purpose, the encapsulation unit 128, 130, 132 may include at least a first inorganic encapsulation layer 128, an organic encapsulation layer 130 on the first inorganic encapsulation layer 128 and a second inorganic encapsulation layer 132 on the organic encapsulation layer 130. That is, the encapsulation unit 128, 130, 132 may be configured to include at least two inorganic encapsulation layers 128 and 132 and at least one organic encapsulation layer 130.

The encapsulation unit 128, 130, 132 of the electroluminescence display panel 110 according to an embodiment of the present disclosure may be described as a structure in which the organic encapsulation layer 130 is sealed between the first inorganic encapsulation layer 128 and the second inorganic encapsulation layer 132.

The first inorganic encapsulation layer 128 may be disposed on the cathode 126. The first inorganic encapsulation layer 128 may be configured to seal a plurality of pixels arranged in the display area AA. The first inorganic encapsulation layer 128 may extend to at least a portion of the non-display area NA. The first inorganic encapsulation layer 128 may be formed of an inorganic insulating material capable of low temperature deposition technique such as silicon nitride (SiNx), silicon oxide (SiOx), silicon oxynitride (SiON), or aluminum oxide (Al2O3). Accordingly, since the first inorganic encapsulation layer 128 is deposited in a low-temperature atmosphere, it is possible to minimize the electroluminescence element 122, which is vulnerable to a high-temperature atmosphere, from being damaged during the deposition process of the first inorganic encapsulation layer 128. For example, when the first inorganic encapsulation layer 128 is formed of silicon nitride, the thickness of the first inorganic encapsulation layer 128 can be set to 0.1 μm to 1.5 μm. However, the present disclosure is not limited thereto. In other words, the Young's modulus of silicon nitride, which is an exemplary inorganic material, can be approximately 100 GPa to 300 GPa. The Young's modulus of the silicon oxide, which is an exemplary inorganic material, can be approximately 70 GPa to 100 GPa. However, the present disclosure is not limited thereto. Since the encapsulation layer made of a silicone substance may have an excellent Young's modulus value, it has characteristics suitable for ultrasonic transmission and reception.

The organic encapsulation layer 130 serves as a buffer for relieving the stress between the respective layers of the electroluminescence display panel 110, enhances the planarization performance, and compensates for foreign matter. Therefore, the flatness and quality of the second inorganic encapsulation layer 141 can be improved. The organic encapsulation layer 130 may be formed of an organic insulating material such as acrylic resin, epoxy resin, polyimide, polyethylene, or silicon oxycarbon (SiOC). The organic encapsulation layer 130 may be formed by a chemical vapor deposition method, an inkjet printing method, or a squeegee method. Further, the organic encapsulation layer 130 can be formed by easily adjusting the thickness. Therefore, the thickness of the encapsulation unit 128, 130, 132 can be easily controlled by adjusting the thickness of the organic encapsulation layer 130. In addition, for convenience of explanation, the thickness of the organic encapsulation layer 130 of the electroluminescence display panel 110 according to an embodiment of the present disclosure will be described with reference to the center region of the electroluminescence element 122.

The second inorganic encapsulation layer 132 may be configured to seal the organic encapsulation layer 130. The second inorganic encapsulation layer 132, may cover the organic encapsulation layer 130, may be configured to contact the first inorganic encapsulation layer 128 to prevent the organic encapsulation layer 130 from being exposed to the outside. In particular, when the side surface of the organic encapsulation layer 130 is exposed to the outside, the organic encapsulation layer 130 may become a moisture and oxygen permeation path for moisture and oxygen, thus, the organic encapsulation layer 130 may be sealed by the first inorganic encapsulation layer 128 and the second inorganic encapsulation layer 132. Accordingly, the first inorganic encapsulation layer 128 and the second inorganic encapsulation layer 132 may be configured to extend further outward than the edge of the organic encapsulation layer 130. Therefore, the organic encapsulation layer 130 can be sealed, and the first inorganic encapsulation layer 128 and the second inorganic encapsulation layer 132 can be configured to contact each other in the non-display area NA. Particularly, when the first inorganic encapsulation layer 128 and the second inorganic encapsulation layer 132 are configured to seal each other to seal the organic encapsulation layer 130, moisture and oxygen permeable to the organic encapsulation layer 130 can be effectively protected. The second inorganic encapsulation layer 132 may be formed of an inorganic insulating material capable of low temperature deposition technique such as silicon nitride (SiNx), silicon oxide (SiOx), silicon oxynitride (SiON), or aluminum oxide (Al2O3). For example, when the second inorganic encapsulation layer 132 is formed of silicon nitride, the thickness of the second inorganic encapsulation layer 132 can be set to 0.1 μm to 1.5 μm. However, the present disclosure is not limited thereto.

The fingerprint sensor 140 of the display device 100 according to an embodiment of the present disclosure may be arranged under the rear side of the electroluminescence display panel 110. In more detail, the fingerprint sensor 140 according to an embodiment of the present disclosure may be attached to the rear side of the substrate 112 of the electroluminescence display panel 110.

A display device 100 according to an embodiment of the present disclosure includes a substrate 112, a transistor (TFT) on the substrate 112, an electroluminescence element 122 on the transistor TFT, an encapsulation unit 128, 130, 132 on the electroluminescence element 122 and an ultrasonic fingerprint sensor 140 under the rear side of the substrate 112, wherein the substrate 112, the transistor TFT, the electroluminescence element 122, and the encapsulation unit 128, 130, 132 corresponding to the fingerprint sensor 140 may serve as a channel for ultrasonic transmission and reception of the fingerprint sensor 140.

The first adhesive member α may be configured to attach the fingerprint sensor 140 and the electroluminescence display panel 110. For example, when the fingerprint sensor 140 and the electroluminescence display panel 110 are disposed close to each other without the first adhesive member 150, a gap or a space may be formed between the fingerprint sensor 140 and the electroluminescence display panel 110. Such a space can significantly affect the ultrasonic signal attenuation in the high frequency band for fingerprint recognition. Therefore, it is preferable that any gap should not be formed.

An area, corresponding to a substrate 112, a transistor TFT, an electroluminescence element 122 and an encapsulation unit 128, 130, 132, serving as a transmission and reception channel of the fingerprint sensor 140 of the display device 100 according to an embodiment of the present disclosure may be configured as a gas-free, a gap-free, and a space-less so as to eliminate the cause of obstructing the transmission and reception of ultrasonic waves.

The display device 100 according to an embodiment of the present disclosure may be configured such that there is no space or gap between the fingerprint sensor 140 and the electroluminescence display panel 110 by the first adhesive member 150. Therefore, it is possible to minimize deterioration of the transmission and reception sensitivity between the fingerprint sensor 140 and the electroluminescence display panel 110. The first adhesive member 150 may be configured to adhere the fingerprint sensor 140 to the substrate 112 and may be configured to have a particular thickness and a particular Young's modulus value suitable for ultrasonic transmission and reception.

As the density or the Young's modulus of the first adhesive member 150 increases, the ultrasonic transmission and reception sensitivity can be improved. In addition, as the thickness of the first adhesive member 150 becomes thinner, the ultrasonic transmission and reception sensitivity can be improved. The first adhesive member 150 may be applied to a region where the fingerprint sensor 140 and the substrate 112 are overlapped with each other. That is, the first adhesive member 150 may be applied to correspond to the area of the fingerprint sensor 140.

The first adhesive member 150 according to an embodiment of the present disclosure may be made of a curable adhesive material. That is, the first adhesive member 150 may be made of a resin that is defoamed and cured by a curable adhesive material. As the curable adhesive material, for example, materials such as acrylic, epoxy, and the like can be used. However, the present disclosure is not limited thereto. In other words, the Young's modulus of the epoxy, which is an exemplary adhesive member, can be approximately 2 GPa to 4 GPa. However, the present disclosure is not limited thereto. In the case of epoxy, since the Young's modulus is a relatively high material, the ultrasonic signal level may not be practically attenuated in ultrasonic transmission.

The thickness of the first adhesive member 150 of the display device 100 according to an embodiment of the present disclosure may be 5 μm to 15 μm. According to the thickness described above, it is possible to reduce the occurrence of bubbles or a foam while minimizing deterioration of the ultrasonic transmission/reception characteristics, and to provide a sufficient adhesive force. However, the present disclosure is not limited thereto. In other words, the adhesive member 150 may be a resin having a property of being defoamed, and the air bubbles may be removed in a cured state, so that the ultrasonic transmission/reception quality may not be reduced.

The color of the first adhesive member 150 according to an embodiment of the present disclosure may be transparent or opaque. In other words, in the case of ultrasonic waves, fingerprints can be recognized irrespective of the light transmittance of the first adhesive member 150.

The first adhesive member 150 according to an embodiment of the present disclosure may be configured not to include a substance having a low density (e.g., low Young's modulus) such as bubbles or gas. For example, if the first adhesive member is a foam tape, since the foam tape contains a plurality of bubbles, the ultrasonic transmission and reception sensitivity can be rapidly lowered. Therefore, difficulties in fingerprint recognition may arise.

In other words, the first adhesive member 150 may be a resin that removes air bubbles, which may interfere with the transmission and reception of ultrasonic waves, or does not contain air bubbles.

According to the first adhesive member 150 according to the embodiment of the present disclosure as described above, the gap between the fingerprint sensor 140 and the electroluminescence display panel 110 can be removed and the fingerprint sensor 140 and the electroluminescence display panel 110 can be adhered, thereby facilitating the ultrasonic transmission and reception.

On the other hand, if one or both of the rear side of the substrate 112 and the surface of the fingerprint sensor 140 that are in contact with each other are implemented or treated with a material having sufficient self-adhesive force, and then the first adhesive member 150 may not be required. In this case, the ultrasonic transmission and reception may be further improved.

Hereinafter, the electroluminescence display panel 110 will be described in terms of the ultrasonic transmission and reception channel of the fingerprint sensor 140.

The electroluminescence display panel 110 according to an embodiment of the present disclosure is designed in consideration of ultrasonic transmission and reception.

The electroluminescence display panel 110 according to an embodiment of the present disclosure may include a flexible substrate 112, having a thickness of 3 μm to 30 μm, configured to transmit ultrasonic waves in a fingerprint recognition area FDA, a transistor TFT, on the flexible substrate 112, configured to transmit ultrasonic waves in the fingerprint recognition area FDA, an electroluminescence element 122, on the transistor TFT, configured to transmit ultrasonic waves in the fingerprint recognition area FDA, a first inorganic encapsulation layer 128, on the electroluminescence element 122, configured to transmit ultrasonic waves in the fingerprint recognition area FDA, an organic encapsulation layer 130, on the first inorganic encapsulation layer 128, having a thickness of 3 μm to 10 μm, configured to transmit ultrasonic waves in a fingerprint recognition area FDA, and a second inorganic encapsulation layer 132, on the organic encapsulation layer 130, configured to transmit ultrasonic waves in the fingerprint recognition area FDA.

The transmission and reception channel of the fingerprint sensor 140 of the display device 100 according to an embodiment of the present disclosure may be configured such that ultrasonic waves output from the fingerprint sensor 140 are reflected by a fingerprint of a user's finger.

For example, the substrate 112 may be formed of glass. As the glass substrate has high density or high Young's modulus value, it can be advantageous for ultrasonic transmission and reception. Further, since the rigidity is excellent even when the fingerprint sensor 140 is attached to the substrate 112, the deformation of the substrate 112 can be minimized.

For example, a portion of the insulating layers of the electroluminescence display panel 110 may be made of an inorganic material. The inorganic material is relatively high in Young's modulus compared to the organic material and can be relatively thin in thickness compared to the organic material. Thus, the inorganic material may affect less influence to the ultrasonic transmission and reception than the organic material.

For example, a part of the insulating layer and a part of the encapsulation unit of the electroluminescence display panel 110 may be made of an organic material. The organic material has a relatively low Young's modulus as compared to an inorganic material. In addition, the organic material may have a planarizing property and may have a relatively thicker thickness than the inorganic material. In addition, the organic material can easily control its thickness. Thus, the organic material may have a greater effect on signal sensitivity to ultrasonic transmission and reception than the inorganic material. Accordingly, it is possible to control the sensitivity of the ultrasonic signal of the fingerprint sensor 140 by adjusting the thickness of the insulating layers made of the organic material.

The thickness of the organic encapsulation layer 130 of the encapsulation unit 128, 130, 132 of the electroluminescence display panel 110 according to an embodiment of the present disclosure may be 3 µm to 10 µm. According to the thickness described above, at the same time, the organic encapsulation layer 130, may compensate the foreign matter of the first inorganic encapsulation layer 128, may planarize the second inorganic encapsulation layer 132, and may perform as a transmission and reception channel of the ultrasonic wave for fingerprint recognition.

A display device 100 (i.e., an apparatus) according to an embodiment of the present disclosure may include an electroluminescence display panel 110 including a substrate 112, a transistor TFT positioned on the substrate 112, an electroluminescence element 122 positioned on the transistor TFT, an encapsulation unit 128, 130, 132 positioned on the electroluminescence element 122, and a fingerprint sensor 140, positioned under the rear side of the electroluminescence display panel 110, configured to output a signal having a frequency from 10 MHz to 15 MHz, wherein the encapsulation unit 128, 130, 132 may include a first inorganic encapsulation layer 128 adjacent to the electroluminescence element 122, an organic encapsulation layer 130 on the first inorganic encapsulation layer 128, and the second inorganic encapsulation layer 132 on the organic encapsulation layer 130, and wherein the thickness of the organic encapsulation layer 130 may be between 3 µm to 10 µm. Thus, the Tx electrodes 141 of the fingerprint sensor 140 may generate a suitable frequency of an ultrasonic wave to pass through the all elements such as the transistor TFT, the electroluminescence element 122, and the encapsulation unit 128, 130, 132 of the electroluminescence display panel 110 and the Rx electrodes 143 may receive the reflected ultrasonic wave by the sensor electrode 144.

In addition, the encapsulation unit 128, 130, 132 may be configured to include at least two inorganic encapsulation layers having a Young's modulus from 70 GPa to 300 GPa.

The fingerprint sensor 140 of the display apparatus 100 according to an embodiment of the present disclosure can detect a user's fingerprint that is in contact with the electroluminescence display panel 110 using a frequency of 10 MHz or more, for example, a frequency of 10 MHz to 15 MHz, and recognize the shape of the fingerprint by recognizing the difference in reflection characteristics of the space (e.g., air) in the valley between the skin portions of the fingerprint. In one embodiment, the fingerprint sensor 140 may transmit a signal that has a frequency that can travel through air (e.g., less than 10 MHz) while still providing high resolution of a user's fingerprint.

In one embodiment, the fingerprint sensor 140 may operate in a fingerprint sensing mode and a proximity sensor mode. In the fingerprint sensing mode, the fingerprint sensor 140 outputs a signal at a frequency (e.g., 10 Mhz to 15 Mhz) for recognizing the shape of the fingerprint. In the proximity sensor mode, the fingerprint sensor 140 outputs a signal at a frequency that is less than the frequency of the fingerprint sensor mode. In the proximity sensor mode, the fingerprint sensor 140 may be used to determine whether the display device is next to a person's face.

In addition, a conventional electroluminescence display panel having a glass substrate generally implemented a frit-seal structure in which a glass portion is melted in a non-display area to form a sealed portion by sealing a non-display region. The conventional frit-seal structure has a simple process and excellent moisture permeability. However, since the frit-seal structure is filled with nitrogen gas above the cathode, there is a problem that the ultrasonic wave for fingerprint recognition is absorbed. Therefore, the embodiments of the present disclosure with the fingerprint sensor 140 may implement a sealing structure such as a face-seal structure, which is suitable for the fingerprint detection. However, the conventional frit-seal structure is not suitable for the fingerprint detection.

The encapsulation unit 128, 130, 132 of the electroluminescence display panel 110 according to an embodiment of the present disclosure is configured not to include any gap or any gas layer along the ultrasonic transmission and reception channel region. That is, between the fingerprint sensor 140 and the electroluminescence display panel 110, there should not be any objects or any space that can attenuate the ultrasonic signal.

According to the above-described configuration, the display device 100 according to an embodiment of the present disclosure may provide a fingerprint sensor 140, an electroluminescence display panel 110 capable of providing a transmission and reception channel or path of the fingerprint sensor 140 while displaying an image by emitting a plurality of pixels PXL, and a first adhesive member 150 for attaching the electroluminescence display panel 110 and the fingerprint sensor 140, thereby recognizing the fingerprint in a fingerprint recognition area where an image is displayed.

Figure 6:
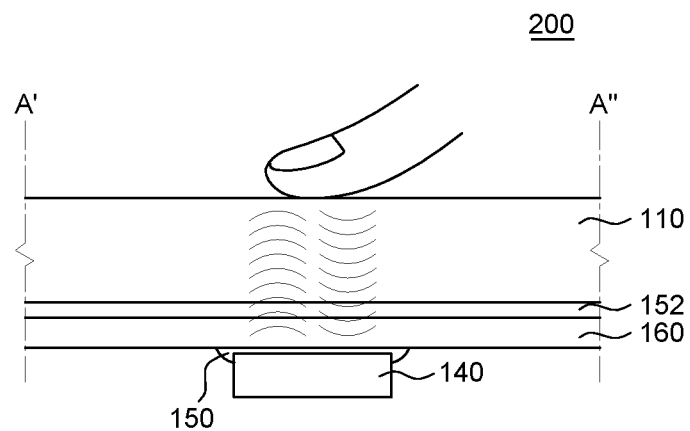
FIG. 6 is a cross-sectional view schematically illustrating a cross section A'-A" corresponding to a fingerprint recognition area of a display device including an electroluminescence display panel capable of providing a fingerprint recognition function according to another embodiment of the present disclosure.

FIG. 6 is a cross-sectional view schematically illustrating a cross section A'-A" corresponding to a fingerprint recognition area of a display device including an electroluminescence display panel capable of providing a fingerprint recognition function according to another embodiment of the present disclosure.

Redundant features of the display device 200 according to another embodiment of the present disclosure and the display device 100 according to an embodiment of the present disclosure may be omitted merely for the sake of convenience of explanation.

Hereinafter, specific elements of the electroluminescence display panel 110 may be described with reference to FIG. 5, if necessary.

The features of the electroluminescence display panel 110, the fingerprint sensor 140, and the first adhesive member 150 of the display device 200 according to another embodiment of the present disclosure may be implemented substantially the same as the features of the electroluminescence display panel 110, the fingerprint sensor 140, and the first adhesive member 150 of the display device 100 according to an embodiment of the present disclosure. Thus, the redundant descriptions with respect to the electroluminescence display panel 110, the fingerprint sensor 140, and the first adhesive member 150 may be omitted merely for convenience of explanation.

The electroluminescence display panel 110 of the display device 200 according to another embodiment of the present disclosure may be configured to include a flexible substrate 112, having a thickness of 3 µm to 30 µm, configured to transmit ultrasonic waves in a fingerprint recognition area FDA, a transistor TFT, on the flexible substrate 112, configured to transmit ultrasonic waves in the fingerprint recognition area FDA, an electroluminescence element 122, on the transistor TFT, configured to transmit ultrasonic waves in the fingerprint recognition area FDA, a first inorganic encapsulation layer 128, on the electroluminescence element 122, configured to transmit ultrasonic waves in the fingerprint recognition area FDA, an organic encapsulation layer 130, on the first inorganic encapsulation layer 128, having a thickness of 3 μm to 10 μm, configured to transmit ultrasonic waves in a fingerprint recognition area FDA, and a second inorganic encapsulation layer 132, on the organic encapsulation layer 130, configured to transmit ultrasonic waves in the fingerprint recognition area FDA. The substrate of the electroluminescence display panel 110 of the display device 200 according to another embodiment of the present disclosure may be formed of a material having a flexibility characteristic. For example, the material of the substrate having flexibility properties may be a polymer resin such as polyethersulphone, polyacrylate, polyetherimide, polyethyelenen-napthalate, polyethylene-terephthalate (PET), polyphenylene-sulfide, polyallylate, polyimide (PI), polycarbonate, photoacrylic, cellulose-acetate-propionate (CAP) or the like. The flexible substrate 112 may be configured to absorb visible light.

If the substrate of the electroluminescence display panel 110 is a flexible substrate other than glass, for example, in the case of a substrate formed of a polyimide material, the density and/or the Young's modulus may be relatively lower than that of glass.

The substrate of the electroluminescence display panel 110 of the display device 200 according to another embodiment of the present disclosure may be made of a flexible material. In other words, the exemplary flexible substrate may be composed of polyimide, and in this case, the Young's modulus of the flexible substrate may be approximately 1.5 GPa to 3 GPa. For example, when the substrate is made of polyimide, the thickness may be 3 μm to 30 μm. However, the present disclosure is not limited thereto. Since the substrate made of polyimide has excellent Young's modulus, it may have suitable characteristics for ultrasonic transmission and reception.

If the thickness of the flexible substrate is 30 μm or more, the flexibility of the electroluminescence display panel 110 can be reduced. If the thickness of the substrate is less than 3 μm, it may be difficult for the substrate to sufficiently support the elements disposed on the electroluminescence display panel 110.

The inventors of the present disclosure have formed the substrate of the electroluminescence display panel 110 as a flexible material and directly bonded to the substrate with the first adhesive member 150. As a result, it has been observed by the inventors of the present disclosure that the display area of the display device where the fingerprint sensor 140 is attached is deformed unevenly due to the stress exerted during the curing of the first adhesive member 150, so that the image quality was reduced.

Thus, the display device 200 according to another embodiment of the present disclosure further includes a support substrate 160 and a second adhesive member 152 disposed between the electroluminescence display panel 110 and the first adhesive member 150. In such case, the substrate 112 of the electroluminescence display panel 110 may be configured to have a flexible characteristic.

The support substrate 160 is disposed between the fingerprint sensor 140 and the electroluminescence display panel 110 including the flexible substrate so that the flatness of the electroluminescence display panel 110 can be improved from being deformed by the stress of the first adhesive member 150.

That is, the support substrate 160 may be disposed between the electroluminescence display panel 110 and the fingerprint sensor 140 to support the fingerprint sensor 140 and the electroluminescence display panel 110. The first adhesive member 150 may be disposed between the support substrate 160 and the electroluminescence display panel 110 to bond the supporting substrate 160 to the electroluminescence display panel 110.

In addition, it is not desirable that there is an empty space in the ultrasonic transmission and reception path or channel of the fingerprint sensor 140, and therefore, an adhesive member capable of filling any empty space is required. However, the first adhesive member may cause stress due to its adhesiveness. Therefore, the stress caused by the first adhesive member 150 needs to be reduced.

The support substrate 160 of the display device 200 according to another embodiment of the present disclosure may be adhered to the electroluminescence display panel 110 by the second adhesive member 152. Further, the fingerprint sensor 140 may be adhered to the support substrate 160. The support substrate 160 may be configured to support a display area AA of the electroluminescence display panel 110 and a non-display area NA surrounding the periphery of the display area AA.

The support substrate 160 may be made of, for example, polyethylene-terephthalate (PET). In other words, the Young's modulus of the exemplary support substrate 160 may be approximately 2.5 GPa to 3.5 GPa. However, the present disclosure is not limited thereto. For example, when the support substrate 160 is made of polyethylene-terephthalate, the thickness may be 50 μm to 150 μm. However, the present disclosure is not limited thereto. The support substrate made of polyethylene-terephthalate has characteristics suitable for ultrasonic transmission and reception because of its excellent Young's modulus value.

Further, the control unit of the fingerprint sensor 140 may be configured to transmit ultrasonic waves having a proper frequency to pass through the electroluminescence display panel 110 and the support substrate 160 under the back side of the electroluminescence display panel 110, for example, ultrasonic waves having a frequency of 10 MHz to 15 MHz can be generated and transmitted and then received through the Tx electrodes 141 and the Rx electrodes 143.

According to another embodiment of the present disclosure, the support substrate 160, in the region where the fingerprint sensor 140 is attached, of the display device 200 can suppress the deformation of the flatness of the electroluminescence display panel 110 due to the stress exerted by the curing of the adhesive member 150. The support substrate 160 may be placed under the rear surface of the flexible substrate 112, which is configured to transmit ultrasonic waves in the fingerprint recognition area FDA. A fingerprint sensor 140 configured to generate ultrasonic waves in the fingerprint recognition area FDA may be placed under the rear surface of the supporting substrate 160.

The support substrate 160 may have a transparent or opaque characteristic. The support substrate 160 may be configured to absorb visible light.

When the support substrate 160 is transparent, it is convenient to perform a vision inspection to inspect various defects such as bubbles generated when the support substrate 160 is attached to the electroluminescence display panel 110 during the fabrication process, signal wiring defects of the electroluminescence display panel 110, or the like defects. In addition, if any bubbles are present, ultrasonic transmission and reception degradation may occur.

Even if the support substrate 160 is opaque, the visible light transmittance of the support substrate 160 does not have a particular influence on the ultrasonic transmission and reception. For example, the visible light absorption rate of the supporting substrate 160 may be 80% or more.

The second adhesive member 152 may be, for example, a pressure-sensitive adhesive (PAS). In other words, the Young's modulus of the exemplary pressure-sensitive adhesive member may be approximately 0.02 MPa to 0.4 MPa. However, the present disclosure is not limited thereto.

When the second adhesive member 152 is a pressure-sensitive adhesive having a Young's modulus value relatively lower than the other elements, the performance of the ultrasonic transmission and reception channel may be deteriorated as the thickness of the second adhesive member 152 increases.

The thickness of the second adhesive member 152 of the display device 200 according to another embodiment of the present disclosure may be 5 μm to 15 μm. According to the thickness described above, it is possible to provide a sufficient adhesive force while reducing the occurrence of bubbles while minimizing deterioration of the ultrasonic transmission and reception characteristics. However, the present disclosure is not limited thereto.

According to the above-described configuration, the display device 200 according to another embodiment of the present disclosure can reduce the deformation of the display device 200 by the support substrate 160 even if the fingerprint sensor 140 is attached by the first adhesive member 150. Therefore, the appearance and image quality of the display device 200 can be improved. In addition, the thickness of the second adhesive member 152 can be adjusted to remedy deformation of the substrate of the electroluminescence display panel 110 while minimizing deterioration in signal sensitivity with respect to the ultrasonic transmission and reception channel.

Figure 7:
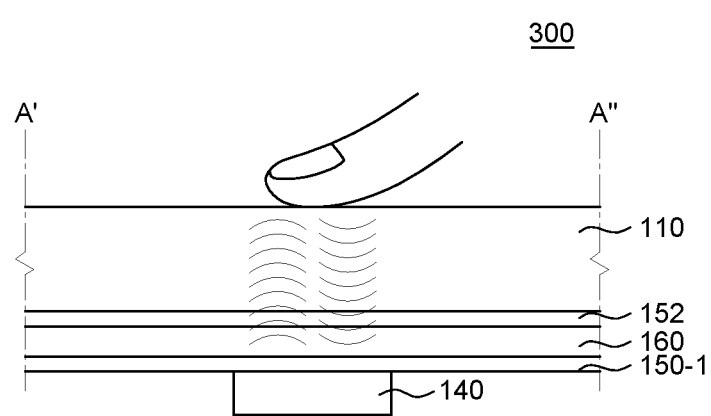
FIG. 7 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 7 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 300 according to the other embodiment of the present disclosure and the display device 200 according to another embodiment of the present disclosure may be omitted merely for the sake of convenience of explanation.

The features of the electroluminescence display panel 110, the fingerprint sensor 140, the support substrate 160, and the second adhesive member 152 of the display device 300 according to the other embodiment of the present disclosure may be implemented substantially the same as the features of the electroluminescence display panel 110, the fingerprint sensor 140, the support substrate 160, and the second adhesive member 152 of the display device 200 according to another embodiment of the present disclosure. Thus, the redundant descriptions with respect to the electroluminescence display panel 110, the fingerprint sensor 140, the support substrate 160, and the second adhesive member 152 may be omitted merely for convenience of explanation.

The first adhesive member 150-1 of the display device 300 according to the other embodiment of the present disclosure may be configured to correspond to the support substrate 160.

For example, the first adhesive member 150-1 may be configured to cover the rear surface of the support substrate 160, or may have a specific area corresponding to the support substrate 160.

For example, the first adhesive member 150-1 may be configured to overlap at least the display area AA of the electroluminescence display panel 110. That is, the first adhesive member 150-1 may be configured to cover the display area AA of the electroluminescence display panel 110.

For example, the first adhesive member 150-1 may be configured to overlap at least the display area AA and the non-display area NA of the electroluminescence display panel 110.

For example, the second adhesive member 152 may be disposed on the front surface of the supporting substrate 160, and the first adhesive member 150-1 may be disposed under the rear surface of the supporting substrate 160.

For example, the first adhesive member 150-1 and the second adhesive member 152 may be made of the same material.

The adhesive member 150-1 may be configured to have a predetermined thickness in consideration of transmission characteristics of ultrasonic frequency for fingerprint recognition.

The first adhesive member 150-1 may be composed of a pressure-sensitive adhesive. In other words, the Young's modulus of the exemplary pressure-sensitive adhesive member may be approximately 0.02 MPa to 0.4 MPa. At this time, the thickness of the first adhesive member 150-1 may be 5 μm to 15 μm. However, the present disclosure is not limited thereto.

According to the above-described configuration, the first adhesive member 150-1 can provide sufficient adhesion force to support the fingerprint sensor 140 and the supporting substrate 160 while minimizing degradation of ultrasonic transmission and reception characteristics. Unlike the first adhesive member 150 according to an embodiment of the present disclosure, the first adhesive member 150-1 according to the other embodiment of the present disclosure may be formed as a film-type adhesive on the supporting substrate 160 and then adhered to the fingerprint sensor 140. In this case, since the first adhesive member 150-1 may not require additional curing process, the stress may be reduced as compared to the first adhesive member 150 according to an embodiment of the present disclosure. Therefore, deformation of the flatness of the electroluminescence display panel 110 can be relatively reduced by the first adhesive member 150-1 than that of the first adhesive member 150.

In addition, since the first adhesive member 150-1 can be provided in other areas other than the fingerprint sensor 140, elements other than the fingerprint sensor 140 can be adhered. In addition, a plurality of fingerprint sensors 140 may be attached at various positions.

Figure 8:
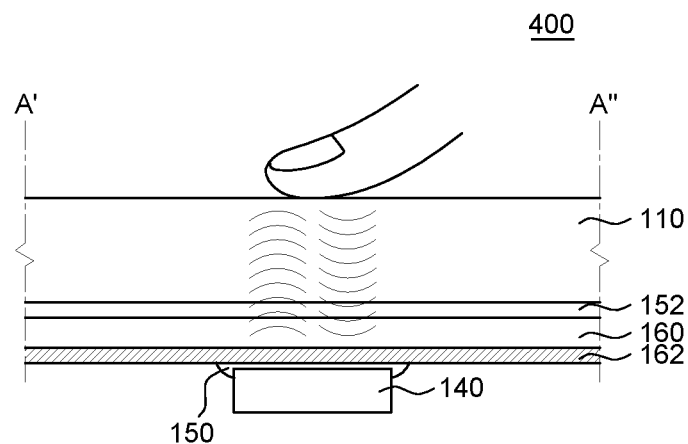
FIG. 8 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 8 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 400 according to the other embodiment of the present disclosure and the display device 200 according to another embodiment of the present disclosure may be omitted merely for the sake of convenience of explanation.

The features of the electroluminescence display panel 110, the fingerprint sensor 140, the support substrate 160, and the second adhesive member 152 of the display device 400 according to the other embodiment of the present disclosure may be implemented substantially the same as the features of the electroluminescence display panel 110, the fingerprint sensor 140, the support substrate 160, and the second adhesive member 152 of the display device 200 according to another embodiment of the present disclosure. Thus, the redundant descriptions with respect to the electroluminescence display panel 110, the fingerprint sensor 140, the support substrate 160, and the second adhesive member 152 may be omitted merely for convenience of explanation.

The inventors of the present disclosure have bonded the fingerprint sensor 140 to the electroluminescence display panel 110 with the first adhesive member 150. When the fingerprint sensor 140 is attached to the electroluminescence display panel 110 and exposed to external light for a certain time or more, the degree of external light exposure of the TFT corresponding to the fingerprint recognition area FDA of the electroluminescence display panel 110 may be different from the area other than the fingerprint recognition area FDA. Further, it has been observed that due to the difference, defects may occur, for example, shadow-mura, in which the transistor TFT characteristics of the pixel PXL may be changed in the region where the fingerprint sensor 140 is attached.

Thus, the display device 400 according to the other embodiment of the present disclosure may be configured to include the light-shield member 162 disposed between the supporting substrate 160 and the fingerprint sensor 140.

The display device 400 according to the other embodiment of the present disclosure may include an electroluminescence display panel 110 including a fingerprint detection area (fingerprint recognition area), a display area AA configured to display an image and a non-display area NA around the display area AA, a support substrate 160 configured to support the electroluminescence display panel 110, a fingerprint sensor 140 under the rear surface of the support substrate 160, and a light-shield member 162, under the support substrate 160, configured to light-shield the fingerprint sensor 140.

A display device 400 according to the other embodiment of the present disclosure may include an electroluminescence display panel 110 including a plurality of pixels PXL, a support substrate 160 adhered to a rear side of the electroluminescence display panel 110, a light-shield member 162 under at least a portion of a rear side of the support substrate 160, and a fingerprint sensor 140 attached to the rear side of the light-shield member 162 by a first adhesive member 150.

A display device 400 according to the other embodiment of the present disclosure may include an electroluminescence display panel 110 including a plurality of pixels PXL on a flexible substrate and an encapsulation unit covering the plurality of pixels PXL, a transparent support substrate 160 under a rear surface of the electroluminescence display panel 110, a light-shield member 162 at a certain area of a rear surface of the transparent support substrate 160, a cushion member 168, including an opening corresponding to the certain area, under the rear surface of the transparent support substrate 160, and a ultrasonic fingerprint sensor 140 attached to the light-shield member 162 at the opening.

The light-shield member 162 may suppress the occurrence of shadow-mura due to the attachment of the fingerprint sensor 140. The light-shield member 162 can minimize the deterioration of the signal sensitivity of the ultrasonic transmission and reception channel of the fingerprint sensor 140. Thus, the control unit of the fingerprint sensor 140 may generate ultrasonic waves of a suitable frequency to pass through the light-shield member 162 disposed under the rear surface of the electroluminescence display panel 110. For example, 10 MHz to 15 MHz signal may be generated, and then the Tx electrodes 141 and Rx electrodes 143 may transmit and receive the ultrasonic waves.

The light-shield member 162 may be configured to shield at least the area where the fingerprint sensor 140 and the electroluminescence display panel 110 overlap. However, the present disclosure is not limited thereto, and the light-shield member 162 may be configured to shield all of the display area AA. Further, the light-shield member 162 may be configured to shield the display area AA and the non-display area NA.

The light-shield member 162 may be made of a material having a material having at least 80% of a visible light absorption rate. However, the present disclosure is not limited thereto. As an example, if the display device including the electroluminescence display panel 110 is used in an automobile interior or in an environment with a large influence of visible light, such as a kiosk in a public place, and then it may be suitably applied by adjusting the area, thickness, absorption rate, and the like of the light-shield member 162.

For example, the light-shield member 162 may include a visible light absorbing dye or a polyethylene-terephthalate having a black color. The light-shield member 162 may be configured to include at least one of graphite, carbon, and graphene.

The light-shield member 162 may be coated directly to the rear side of the support substrate 160 or may be bonded together by a separate bonding member. When the light-shield member 162 is made of polyethylene-terephthalate, the thickness of the light-shield member 162 may be made thinner than the thickness of the support substrate 160. That is, since the light-shield member 162 shields the fingerprint sensor 140 from the electroluminescence display panel 110, the thickness of the support substrate 160 for providing the flatness of the electroluminescence display panel 110 can be relatively thinner. However, the present disclosure is not limited thereto. For example, the thickness of the light-shield member 162 including polyethylene terephthalate may be 10 μm to 25 μm.

For example, the light-shield member 162 may be made of a light absorbing ink. The light-shield member 162 may be coated directly under the rear surface of the support substrate 160. When the light-shield member 162 is a light absorbing ink, the thickness of the light-shield member 162 may be made thinner than the thickness of the support substrate 160. For example, the thickness of the light-shield member 162 including the light absorbing ink may be 8 μm to 20 μm. According to the above-described configuration, even if the fingerprint sensor 140 is attached by the light-shield member 162, the occurrence of shadow-mura in the electroluminescence display panel 110 can be suppressed and the deterioration of signal sensitivity of the ultrasonic transmission and reception channel can be minimized. In addition, the flatness of the electroluminescence display panel 110 can be improved by the light-shield member 162. In addition, the thickness of the light-shield member 162 may be 8 μm to 25 μm.

The thickness of the light-shield member 162 may be thinner than the thickness of the support substrate 160 and the thickness of the light-shield member 162 may be made thinner than the thickness of the cushion member 168.

Figure 9:
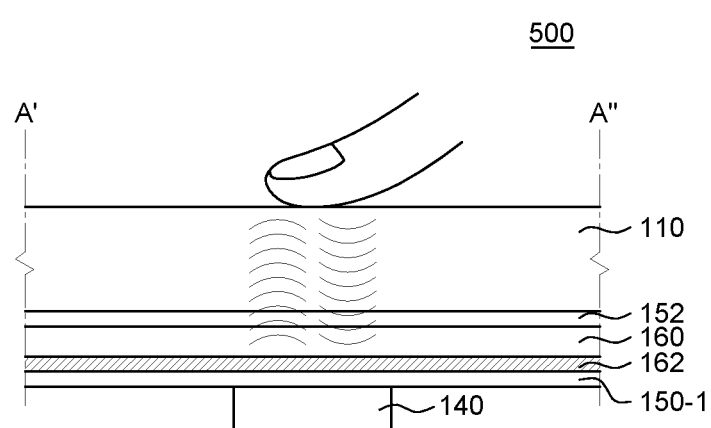
FIG. 9 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 9 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 500 according to the other embodiment of the present disclosure and the display device 300 according to the other embodiment of the present disclosure may be omitted merely for the sake of convenience of explanation.

The features of the electroluminescence display panel 110, the fingerprint sensor 140, the support substrate 160, the first adhesive member 150-1 and the second adhesive member 152 of the display device 500 according to the other embodiment of the present disclosure may be implemented substantially the same as the features of the electroluminescence display panel 110, the fingerprint sensor 140, the support substrate 160, the first adhesive member 150-1 and the second adhesive member 152 of the display device 300 according to the other embodiment of the present disclosure. Thus, the redundant descriptions may be omitted merely for convenience of explanation.

The features of the light-shield member 162 of the display device 500 according to the other embodiment of the present disclosure may be implemented substantially the same as the features of the light-shield member 162 of the display device 400 according to the other embodiment of the present disclosure. Thus, the redundant descriptions may be omitted merely for convenience of explanation.

The display device 500 according to the other embodiment of the present disclosure may be configured to include the light-shield member 162 disposed between the support substrate 160 and the fingerprint sensor 140.

According to the above-described configuration, even if the fingerprint sensor 140 is attached to the light-shield member 162, the occurrence of shadow-mura in the electroluminescence display panel 110 can be suppressed and the deterioration of signal sensitivity of the ultrasonic transmission and reception channel can be minimized. In addition, the flatness of the electroluminescence display panel 110 can be improved by the light-shield member 162.

According to the above-described configuration, the first adhesive member 150-1 can minimize the deterioration of the ultrasonic transmission and reception characteristics, and the first adhesive member 150-1 can be further provided to the area other than the attachment area of the fingerprint sensor 140, thereby some components other than the fingerprint sensor 140 may be attached by the first adhesive member 150-1.

Figure 10:
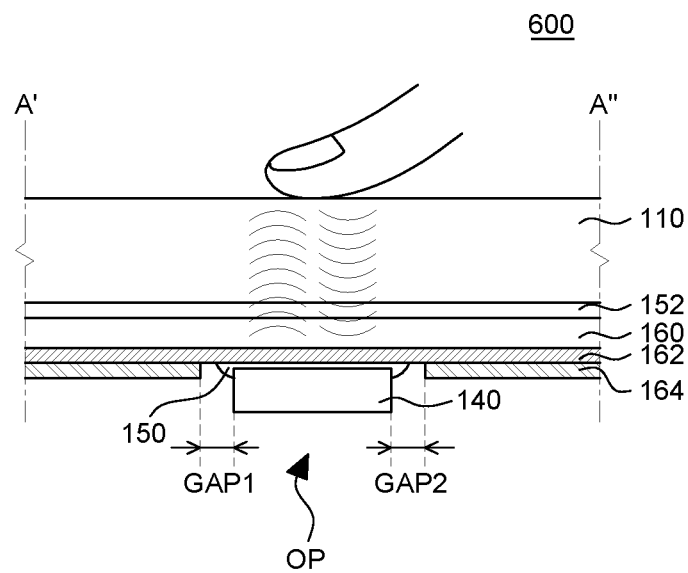
FIG. 10 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 10 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 600 according to the other embodiment of the present disclosure and the display device 400 according to the other embodiment of the present disclosure may be omitted merely for the sake of convenience of explanation.

The features of the electroluminescence display panel 110, the fingerprint sensor 140, the support substrate 160, the first adhesive member 150, the second adhesive member 152, and the light-shield member 162 of the display device 600 according to the other embodiment of the present disclosure may be implemented substantially the same as the features of the electroluminescence display panel 110, the fingerprint sensor 140, the support substrate 160, the first adhesive member 150, the second adhesive member 152, and the light-shield member 162 of the display device 400 according to the other embodiment of the present disclosure. Thus, the redundant descriptions may be omitted merely for convenience of explanation.

The inventors of the present disclosure have found that when the fingerprint sensor 140 is disposed under the rear side of the electroluminescence display panel 110, the heat dissipation characteristic of the rear side of the electroluminescence display panel 110 may be varied by the arrangement of the fingerprint sensor 140. In addition, it is also observed that a residual image may be generated on the displayed image due to the temperature deviation of the electroluminescence display panel 110 according to the heat radiation deviation.

Accordingly, the display device 600 according to the other embodiment of the present disclosure may be configured to include the heat dissipation member 164 disposed under the rear surface of the light-shield member 162.

The heat dissipation member 164 may be configured to surround the fingerprint sensor 140 and overlap a portion of the display area AA to perform the function of a heat sink for the electroluminescence display panel 110. For example, the heat dissipation member 164 may be configured to substantially cover the display area AA excluding the opening OP.

In addition, an adhesive member may be further included between the heat dissipation member 164 and the light-shield member 162. However, it should be noted that since the adhesive member corresponding to the region other than the ultrasonic transmission and reception channel of the fingerprint sensor 140 does not substantially affect the performance of the ultrasonic transmission and reception channel. Therefore, the region other than the ultrasonic transmission and reception channel of the fingerprint sensor 140 may be omitted for convenience of explanation.

In addition, the heat dissipation member 164 may be configured to have an opening OP corresponding to the fingerprint sensor 140. The opening OP may have gaps GAP1 and GAP2 spaced apart from the fingerprint sensor 140 by a particular distance. According to the above-described configuration, the heat dissipation member 164 can be separated from the first adhesive member 150 regardless of the thickness or the step the first adhesive member 150. Therefore, delamination or peel-off of the heat dissipation member 164 due to the level of the first adhesive member 150 may be suppressed.

The heat dissipation member 164 may be made of a material having a high thermal conductivity. For example, the heat dissipation member 164 may be made of a material such as metal, graphite, and/or graphene. For example, the thickness of the heat dissipation member 164 may be 50 μm to 100 μm. However, the present disclosure is not limited thereto.

According to the above-described configuration, the temperature deviation between the fingerprint sensor 140 and periphery of the fingerprint sensor 140 can be reduced by the heat dissipation member 164. Therefore, it is possible to reduce the occurrence of image retention due to the attachment of the fingerprint sensor 140.

In addition, when the heat dissipation member 164 is a conductive material, the heat dissipation member 164 can be electrically grounded. However, the present disclosure is not limited thereto.

On the other hand, the heat dissipation member 164-1 may not be bonded as a separate element. By improving a particular component, such as a layer, a structure and/or its material to improve its heat dissipation function, thereby substituting the heat dissipation member. In such case, the light-shield member 162 may substitute the heat dissipation member.

Figure 11:
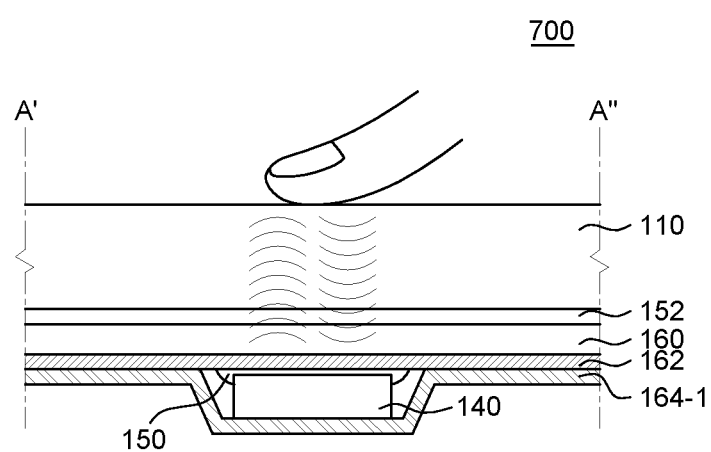
FIG. 11 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 11 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 700 according to the other embodiment of the present disclosure and the display device 600 according to the other embodiment of the present disclosure may be omitted merely for the sake of convenience of explanation.

The features of the electroluminescence display panel 110, the fingerprint sensor 140, the support substrate 160, the first adhesive member 150, the second adhesive member 152, and the light-shield member 162 of the display device 700 according to the other embodiment of the present disclosure may be implemented substantially the same as the features of the electroluminescence display panel 110, the fingerprint sensor 140, the support substrate 160, the first adhesive member 150, the second adhesive member 152, and the light-shield member 162 of the display device 600 according to the other embodiment of the present disclosure. Thus, the redundant descriptions may be omitted merely for convenience of explanation.

The heat dissipation member 164-1 of the display device 700 according to the other embodiment of the present disclosure may be implemented substantially the same material as the heat dissipation member 164 of the display device 600 according to the other embodiment of the present disclosure. Thus, the redundant descriptions may be omitted merely for convenience of explanation.

The display device 700 according to the other embodiment of the present disclosure may be configured to include the heat dissipation member 164-1 below the rear side of the light-shield member 162. The heat dissipation member 164-1 may be configured to cover the fingerprint sensor 140. That is, the heat dissipation member 164-1 may be configured to overlap with the fingerprint sensor 140.

For example, the heat dissipation member 164-1 may be configured to adhere to the light-shield member 162 while surrounding the fingerprint sensor 140.

For example, the heat dissipation member 164-1 may be configured to package the fingerprint sensor 140. Further, the heat dissipation member 164-1 may be attached only to the rear side of the fingerprint sensor 140 without contacting the light-shield member 162.

According to the above-described configuration, the heat dissipation member 164-1 can heat sink the heat generated from the electroluminescence display panel 110 and the fingerprint sensor 140. According to the above-described configuration, the temperature deviation around the fingerprint sensor 140 and the fingerprint sensor 140 can be reduced by the dissipation member 164-1. Therefore, it is possible to reduce the occurrence of a residual image due to a temperature deviation due to the attachment of the fingerprint sensor 140. The position, thickness, area, material, and the like of the heat dissipation member 164-1 may be variously modified according to the type, size, use environment, purpose of use, and the like of the display device including the fingerprint sensor 140.

Figure 12:
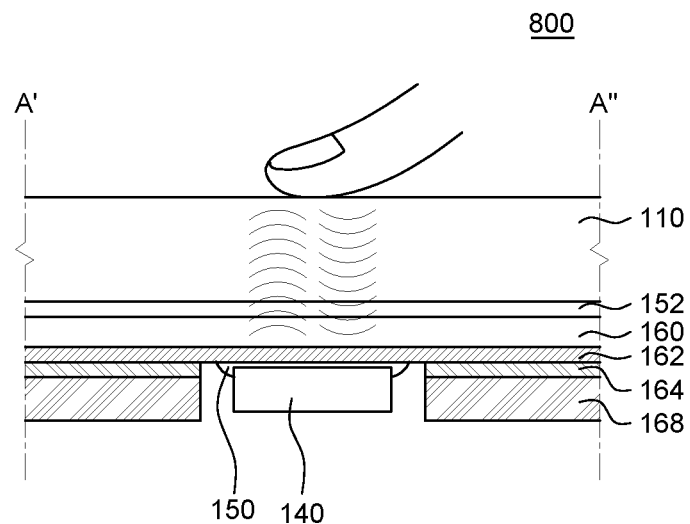
FIG. 12 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 12 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 800 according to the other embodiment of the present disclosure and the display device 600 according to the other embodiment of the present disclosure may be omitted merely for the sake of convenience of explanation.

The features of the electroluminescence display panel 110, the fingerprint sensor 140, the support substrate 160, the first adhesive member 150, the second adhesive member 152, the light-shield member 162, the heat dissipation member 164 of the display device 800 according to the other embodiment of the present disclosure may be implemented substantially the same as the features of the electroluminescence display panel 110, the fingerprint sensor 140, the support substrate 160, the first adhesive member 150, the second adhesive member 152, the light-shield member 162, the heat dissipation member 164 of the display device 600 according to the other embodiment of the present disclosure. Thus, the redundant descriptions may be omitted merely for convenience of explanation.

The inventors of the present disclosure have observed that when the fingerprint sensor 140 is disposed under the rear surface of the electroluminescence display panel 110, the electroluminescence display panel 110 and the fingerprint sensor 140 may be damaged by an external impact due to an arrangement of the fingerprint sensor 140.

In addition, the fingerprint sensor 140 may be constituted by a substrate having a high Young's modulus value for transmitting ultrasonic waves for fingerprint transmission, for example, ultrasonic waves having a frequency of 10 MHz or more. Therefore, the fingerprint sensor 140 may be damaged by an external impact.

The display device 800 according to the other embodiment of the present disclosure may be configured to include a cushion member 168 disposed under the rear surface of the heat dissipation member 164. The cushion member 168 of the present disclosure may refer to a member configured to absorb an impact. For example, the cushion member 168 may be a material having a high elasticity or having a deformable property to absorb a shock and having an excellent restoration ability.

The cushion member 168, surrounds the fingerprint sensor 140, may be configured to overlap with at least a portion of the display area AA to absorb a shock transmitted to the electroluminescence display panel 110 and the fingerprint sensor 140. For example, the cushion member 168 may be configured to cover the entire display area AA except for the opening OP. The cushion member 168 may absorb the impact that may be transmitted through the electroluminescence display panel 110, thereby protecting the ultrasonic fingerprint sensor 140. The cushion member 168 may be made of a light absorbing material. Therefore, the shadow-mura may be be reduced by the cushion member 168 as well.

The cushion member 168 may be configured not to be disposed between the fingerprint sensor 140 and the electroluminescence display panel 110 if the ultrasonic wave, dedicated for fingerprint recognition, having at least 10 MHz of frequency. Ultrasonic waves can be absorbed if the cushion member 168 is disposed in the middle of the ultrasonic transmission and reception channel.

In addition, an adhesive member may be further included between the cushion member 168 and the heat dissipation member 164. However, it should be noted that since the adhesive member corresponding to the region other than the ultrasonic transmission and reception channel of the fingerprint sensor 140 does not substantially affect the performance of the ultrasonic transmission and reception channel. Therefore, the region other than the ultrasonic transmission and reception channel of the fingerprint sensor 140 may be omitted for convenience of explanation.

In addition, the cushion member 168 may be configured to have an opening corresponding to the fingerprint sensor 140. The opening may have gaps spaced a certain distance from the fingerprint sensor 140. Since the opening and the gaps are illustrated in FIG. 10, a redundant description will be omitted for convenience of explanation. According to the above-described configuration, the cushion member 168 can be separated from the first adhesive member 150 regardless of the step of the first adhesive member 150. Therefore, peeling of the cushion member 168 due to the step of the first adhesive member 150 can be suppressed.

In addition, the light-shield member 162 may be configured to shield the opening of the cushion member 168 to shield the rear side of the electroluminescence display panel 110 from light.

The cushion member 168 may be made of an impact-absorbing material. For example, the cushion member 168 may be made of a material such as foam tape and/or rubber. For example, the thickness of the cushion member 168 may be 60 μm to 200 μm. However, the present disclosure is not limited thereto.

For example, according to the above-described configuration, when the cushion member 168 is a foam tape, even if an impact is transmitted to the electroluminescence display panel 110, it is possible to reduce the impact transmitted from the display panel 110 to the fingerprint sensor 140 by the cushion member 168. Therefore, when the electroluminescence display panel 110 is shocked, the fingerprint sensor 140 may be protected from being damaged.

In addition, when the cushion member 168 is a foam tape, the foam tape can absorb ultrasonic waves for fingerprint recognition because it contains a plurality of bubbles. Therefore, it is possible to absorb the unnecessary transmission of the ultrasonic wave to the area other than the fingerprint recognition area FDA of the electroluminescence display panel 110. Therefore, unnecessary ultrasonic noise can be reduced. However, the present disclosure is not limited thereto. Therefore, the cushion member 168 according to the embodiments of the present disclosure may be referred to as an ultrasonic absorbing member for fingerprint recognition.

The cushion member 168 may be positioned under the rear side of the support substrate 160 and surround the fingerprint sensor 140. A portion of the outer periphery of the light-shield member 162 may be overlapped with the cushion member 168.

In some cases, the cushion member 168 and the heat dissipation member 164 may be embodied as one member rather than separate members. That is, the present disclosure can be realized as a material that can integrate a cushion function and a heat dissipation function together with a single film or layer type member. Such an integrated functional member The position, thickness, area, material, and the like of such an integrated functional member may be variously modified according to the type, size, use environment, purpose of use, and the like of the display device including the fingerprint sensor 140.

Figure 13:
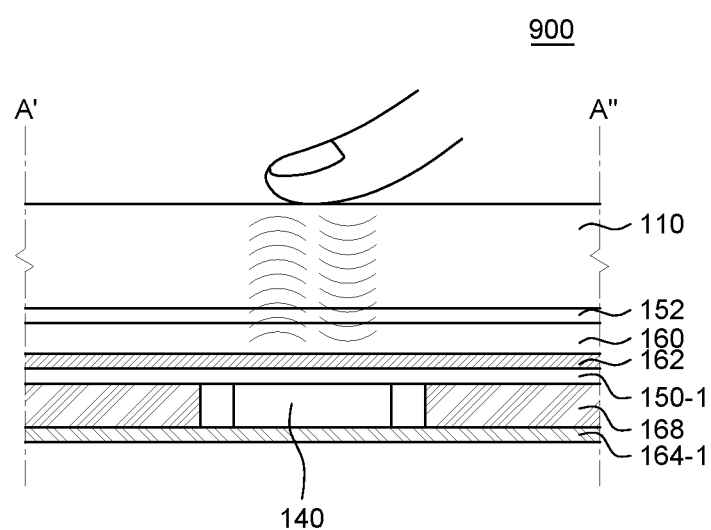
FIG. 13 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 13 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 900 according to the other embodiment of the present disclosure and the display devices 500, 800 according to the embodiments of the present disclosure may be omitted merely for the sake of convenience of explanation.

The features of the electroluminescence display panel 110, the fingerprint sensor 140, the support substrate 160, the first adhesive member 150-1, the second adhesive member 152, and the light-shield member 162 of the display device 900 according to the other embodiment of the present disclosure may be implemented substantially the same as the features of the electroluminescence display panel 110, the fingerprint sensor 140, the support substrate 160, the first adhesive member 150-1, the second adhesive member 152, and the light-shield member 162 of the display device 500 according to the other embodiment of the present disclosure. Thus, the redundant descriptions may be omitted merely for convenience of explanation.

The cushion member 168 of the display device 900 according to the other embodiment of the present disclosure may be implemented substantially the same material as the cushion member 168 of the display device 800 according to the other embodiment of the present disclosure. Thus, the redundant descriptions may be omitted merely for convenience of explanation.

The display device 900 according to the other embodiment of the present disclosure may be configured to include the heat dissipation member 164-1 under the rear surface of the cushion member 168. The heat dissipation member 164-1 may be configured to cover the fingerprint sensor 140. That is, the heat dissipation member 164-1 may be configured to overlap with the fingerprint sensor 140.

For example, the heat dissipation member 164-2 may be configured to be in direct contact with the cushion member 168 and the fingerprint sensor 140.

According to the above-described configuration, the heat dissipation member 164-1 may transfer heat generated in the fingerprint sensor 140. Further, a system circuitry connected to the electroluminescence display panel 110 may be further disposed under the rear surface of the heat dissipation member 164-1. Further, a frame for supporting the electroluminescence display panel 110 and the system circuitry may be further disposed between the electroluminescence display panel 110 and the system circuitry. In this case, the heat dissipation member 164-1 can transfer heat of the fingerprint sensor 140 toward the frame. According to the above-described configuration, the temperature deviation around the fingerprint sensor 140 and the fingerprint sensor 140 can be reduced by the heat dissipation member 164-1. Therefore, it is possible to reduce the occurrence of a residual image due to a temperature deviation due to the attachment of the fingerprint sensor 140.

In addition, the level difference between the fingerprint sensor 140 and the heat dissipation member 164-1 can be reduced by the cushion member 168. According to the above-described configuration, as compared with the heat dissipation member 164-1 of the display device 700 according to the other embodiment of the present disclosure, the possibility of generating a tension that can be generated by the heat dissipation member 164-1 can be reduced.

In addition, when the heat dissipation member 164-1 of the display device 700 according to the other embodiment of the present disclosure is adhered, a pressure may be applied to the fingerprint sensor 140 due to a misalign error in the adhesion process. In such case, the fingerprint sensor 140 may apply unwanted pressure to the electroluminescence display panel 110. Accordingly, the flatness of the electroluminescence display panel 110 may be lowered, and the pressed mark may be visually recognized.

However, when the step between the fingerprint sensor 140 and the heat dissipation member 164-1 is minimized by the cushion member 168, the pressure that can be applied to the fingerprint sensor 140 when adhering the heat dissipation member 164-1 can be minimized. Therefore, occurrence of a flatness defect of the electroluminescence display panel 110 can be reduced.

Figure 14:
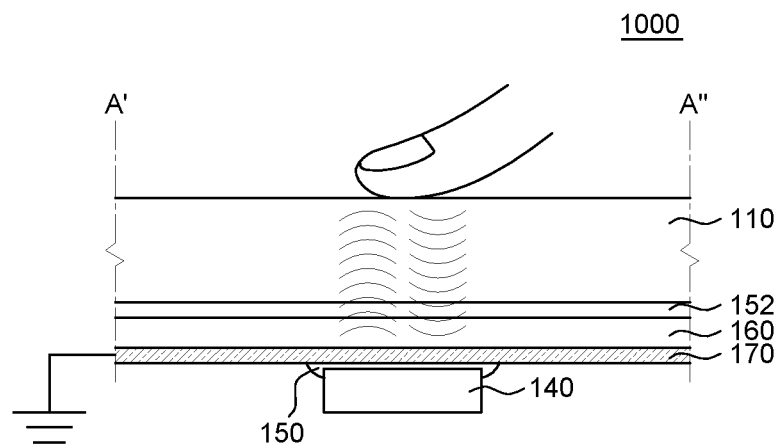
FIG. 14 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 14 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1000 according to the other embodiment of the present disclosure and the display device 200 according to another embodiment of the present disclosure may be omitted merely for the sake of convenience of explanation.

The features of the electroluminescence display panel 110, the fingerprint sensor 140, the support substrate 160, and the second adhesive member 152, of the display device 1000 according to the other embodiment of the present disclosure may be implemented substantially the same as the features of the electroluminescence display panel 110, the fingerprint sensor 140, the support substrate 160, and the second adhesive member 152 of the display device 200 according to another embodiment of the present disclosure. Thus, the redundant descriptions may be omitted merely for convenience of explanation.

The inventors of the present disclosure have recognized that the electromagnetic interference (EMI) generated by the scan pulse and the data signal of the electroluminescence display panel 110 may become a noise to the fingerprint sensor 140. Further, the inventors of the present disclosure have recognized that electromagnetic interference generated by the operation of the fingerprint sensor 140 may become a noise of the electroluminescence display panel 110.

Particularly, the ultrasonic fingerprint sensors may require a high voltage to generate a high frequency of ultrasonic wave. Accordingly, electromagnetic interference can be generated. However, the present disclosure is not limited to the driving voltage level of the fingerprint sensor 140.

Accordingly, the electroluminescence display panel 110 may be deteriorated in image quality due to the electromagnetic interference of the fingerprint sensor 140, but also, at the same time, the fingerprint sensor 140 may be deteriorated in fingerprint recognition sensitivity due to the electromagnetic interference of the electroluminescence display panel 110.

Thus, the display device 1000 according to the other embodiment of the present disclosure may be configured to include the EMI shield member 170 disposed between the support substrate 160 and the fingerprint sensor 140.

A display device 1000 according to the other embodiment of the present disclosure may include a substrate, a display area including a plurality of pixels on the substrate and having a fingerprint recognition area FDA, a support substrate 160 under the rear surface of the substrate, a fingerprint sensor 140 under the rear surface of the support substrate 160 in accordance with the fingerprint recognition area FDA, and an EMI shield member 170 disposed between the support substrate 160 and the fingerprint sensor 140.

A display device 1000 according to the other embodiment of the present disclosure may include an electroluminescence display panel 110 including a plurality of pixels PXL on a flexible substrate, a support substrate 160 supporting the electroluminescence display panel 110, and a EMI shield member 170 under a rear surface of the support substrate 160 configured to transmit an ultrasonic wave of a particular frequency.

A display device 1000 according to the other embodiment of the present disclosure may include a substrate on which a plurality of pixels PXL are arranged thereon, a see-through support substrate 160 under a rear surface of the substrate, a cushion member 168, including an opening, under a rear surface of the see-through support substrate 160, an ultrasonic fingerprint sensor 140 at the opening, and an EMI shield member, overlaps with the opening, configured to shield an electromagnetic interference noise through the see-through support substrate 160 that may affect the ultrasonic fingerprint sensor 140.

A display device 1000 according to the other embodiment of the present disclosure may include an electroluminescence display panel 110, a fingerprint sensor 140 under a rear surface of the electroluminescence display panel 110, and an EMI shield member 170 that is a part of an ultrasonic transmission and reception channel of the fingerprint sensor 140, configured to shield a plurality of electrical signals generated in the electroluminescence display panel 110, thereby improving the image quality of the electroluminescence display panel 110.

The EMI shield member 170 may be configured to shield at least a region where the fingerprint sensor 140 and the electroluminescence display panel 110 are overlapped. For example, the EMI shield member 170 may be configured to shield at least the fingerprint recognition area FDA. However, the present disclosure is not limited thereto. Further, the EMI shield member 170 may be configured to shield the fingerprint recognition area FDA and at least a portion of the display area AA. Furthermore, the EMI shield member 170 may be configured to shield the display area AA and the non-display area NA. That is, the EMI shield member 170 may be configured to shield at least the electromagnetic interference noise between the electroluminescence display panel 110 and the fingerprint sensor 140 by shielding at least the fingerprint recognition area FDA.

The fingerprint sensor 140 may be fixed to the rear side of the EMI shield member 170 and output ultrasonic waves of a specific frequency toward the EMI shield member 170. The control unit of the fingerprint sensor 140 may generate an ultrasonic wave having a specific frequency band such as 10 MHz to 15 MHz to allow the ultrasonic wave to pass through the EMI shield member 170 disposed under the rear side of the electroluminescence display panel 110 such that the ultrasonic wave can be transmitted and received through the Tx electrodes 141 and the Rx electrodes 143.

The EMI shield member 170 may be made of a conductive material. For example, the EMI shield member 170 may comprise metallic particles or may be a metal foil. The EMI shield member 170 may be coated directly at the rear side of the support substrate 160 or may be bonded together through a separate bonding member. When the EMI shield member 170 is a conductive ink, the thickness of the EMI shield member 170 may be 300 nm or less. For example, the thickness of the EMI shield member 170 may be between 25 nm and 300 nm. The EMI shield member 170 may be a metal layer and may be configured to shield external light transmitted through the electroluminescence display panel 110.

The inventors of the present disclosure have also recognized that as the thickness of the EMI shield member 170 becomes thicker than 300 nm, the shielding performance of the electromagnetic interference noise may be reduced. It has also been recognized that when the thickness of the EMI shield member 170 is thinner than 25 nm, the shielding performance of the electromagnetic interference performance may be reduced.

Accordingly, the EMI shield member 170 of the display device 100 according to the other embodiment of the present disclosure may be configured to include copper (Cu), and the thickness may be 150 nm to 250 nm. However, the present disclosure is not limited thereto.

For example, the EMI shield member 170 may be a conductive ink. The EMI shield member 170 may be coated or printed directly under the rear side of the support substrate 160.

For example, the EMI shield member 170 may be a thin metal film. The EMI shield member 170 may be deposited on the support substrate 160.

For example, when the EMI shield member 170 is formed directly on the support substrate 160, since an adhesive member is unnecessary, an additional adhesive member may not be required even if the EMI shield member 170 is added. Therefore, it is possible to improve the image quality of the electroluminescence display panel 110 and the fingerprint recognition sensitivity of the fingerprint sensor 140 while maintaining the signal sensitivity of the fingerprint sensor 140.

For example, the electroluminescence display panel 110 may be configured to include a fingerprint recognition area FDA corresponding to a fingerprint sensor 140 and an EMI shield member 170, overlapping with the fingerprint recognition area FDA, having an area larger than an area of the fingerprint sensor 140.

In addition, the EMI shield member 170 may be grounded. When the EMI shield member 170 is electrically grounded, the shielding performance can be improved. In addition, when the EMI shield member 170 is grounded, the transistor TFT of the electroluminescence display panel 110 and the EMI shield member 170 may generate parasitic capacitance. Therefore, in order to minimize the parasitic capacitance of the EMI shield member 170, the distance between the EMI shield member 170 and the electroluminescence display panel 110 may be at least 20 μm. Specifically, the distance between the EMI shield member 170 and the TFT of the electroluminescence display panel 110 may be at least 20 μm. Therefore, even if the EMI shield member 170 is included in the display device 1000, the parasitic capacitance problem can be minimized.

According to the above-described configuration, as the increase in thickness can be minimized, electromagnetic interference noise generated between the fingerprint sensor 140 and the electroluminescence display panel 110 can be shielded by the EMI shield member 170, thereby the fingerprint sensing performance of the fingerprint sensor 140 and the image quality of the electroluminescence display panel 110 can be improved at the same time.

Alternatively, the EMI shield member 170 may be integrated into another element, for example, a support substrate 160, to provide a shielding ability rather than being implemented as a separate component.

Whether to implement the EMI shield member 170 as a separate element, as an integrated element with other element or both can be variously modified according to the type, size, use environment, purpose of use, and the like of the display device including the fingerprint sensor 140.

Figure 15:
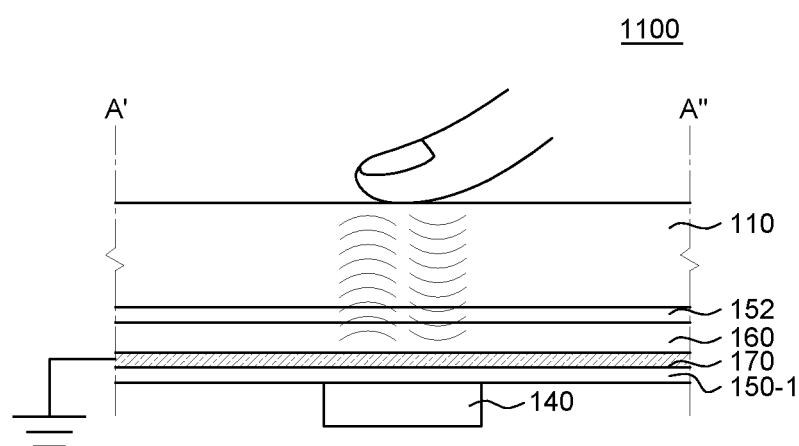
FIG. 15 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 15 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1100 according to the other embodiment of the present disclosure and the display devices 300, 1000 according to the other embodiments of the present disclosure may be omitted merely for the sake of convenience of explanation.

The features of the electroluminescence display panel 110, the fingerprint sensor 140, the support substrate 160, the first adhesive member 150-1, and the second adhesive member 152, of the display device 1100 according to the other embodiment of the present disclosure may be implemented substantially the same as the features of the electroluminescence display panel 110, the fingerprint sensor 140, the support substrate 160, the first adhesive member 150-1, and the second adhesive member 152 of the display devices 300, 1000 according to the other embodiments of the present disclosure. Thus, the redundant descriptions may be omitted merely for convenience of explanation.

The display device 1100 according to the other embodiment of the present disclosure may be configured to include the EMI shield member 170 disposed between the support substrate 160 and the first adhesive member 150-1.

The EMI shield member 170 may be configured to shield at least the area where the fingerprint sensor 140 and the electroluminescence display panel 110 overlap. For example, the EMI shield member 170 may be configured to shield at least the fingerprint recognition area FDA. However, the present disclosure is not limited thereto, and the EMI shield member 170 may be configured to shield at least a part of the fingerprint recognition area FDA and the display area AA. Further, the EMI shield member 170 may be configured to shield the display area AA and the non-display area NA.

According to the above-described configuration, the electromagnetic interference noise generated between the fingerprint sensor 140 and the electroluminescence display panel 110 may be shielded by the EMI shield member 170. Accordingly, the fingerprint sensing performance of the fingerprint sensor 140 and the image quality of the electroluminescence display panel 110 can be improved at the same time.

In addition, since the first adhesive member 150-1 can be provided in other areas except for the fingerprint sensor 140, components other than the fingerprint sensor 140 can be adhered by the first adhesive member 150-1.

In some cases, a metallic material may be included in the first adhesive member 150-1 to substitute the EMI shield member 170 or to provide an additional shielding ability to the first adhesive member 150-1. That is, the EMI shield member may be variously modified according to the type, size, use environment, purpose of use, and the like of the display device including the fingerprint sensor 140.

Figure 16:
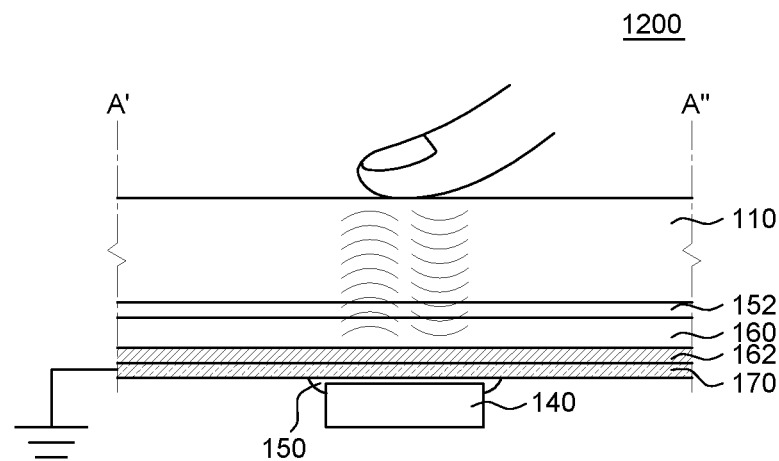
FIG. 16 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 16 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1200 according to the other embodiment of the present disclosure and the display devices 400, 1000 according to the other embodiments of the present disclosure may be omitted merely for the sake of convenience of explanation.

The features of the electroluminescence display panel 110, the fingerprint sensor 140, the support substrate 160, the first adhesive member 150, the second adhesive member 152, and the light-shield member 162, and the EMI shield member 170 of the display device 1100 according to the other embodiment of the present disclosure may be implemented substantially the same as the features of the electroluminescence display panel 110, the fingerprint sensor 140, the support substrate 160, the first adhesive member 150, the second adhesive member 152, and the light-shield member 162, and the EMI shield member 170 of the display devices 400, 1000 according to the other embodiments of the present disclosure. Thus, the redundant descriptions may be omitted merely for convenience of explanation.

The inventors of the present disclosure have recognized that when the EMI shield member 170 is a metallic material, it may have a reflection characteristic with respect to visible light, and when the external light is reflected by the EMI shield member having a reflection characteristic, the image quality of the electroluminescence display panel 110 may be deteriorated.

The display device 1200 according to the other embodiment of the present disclosure may include the light-shield member 162 and the EMI shield member 170 which are sequentially stacked between the support substrate 160 and the fingerprint sensor 140. That is, EM the shield member 170 is positioned under the rear surface of the light-shield member 162.

In addition, if the light-shield member 162 is positioned under the rear surface of the EMI shield member 170, electromagnetic interference noise may be reduced, but it may be difficult to improve the external light reflection problem as described-above.

According to the above-described configuration, the problem of deterioration in image quality due to external light due to the EMI shield member 170 can be suppressed by disposing the light-shield member 162 between the EMI shield member 170 and the electroluminescence display panel 110. That is, the light-shield member 162 can absorb at least a portion of the external light. At the same time, the electromagnetic interference noise generated between the fingerprint sensor 140 and the electroluminescence display panel 110 can be shielded by the EMI shield member 170. Accordingly, the fingerprint sensing performance of the fingerprint sensor 140 and the image quality of the electroluminescence display panel 110 can be improved at the same time.

Herein, the light-shield member 162 and the EMI shield member 170 are described as separate elements but it may be realized as a single film or layer that integrate a light-shielding function and an EMI shielding function together. That is, the integrated shield member may be variously modified according to the type, size, use environment, purpose of use, and the like of the display device including the fingerprint sensor 140.

Figure 17:
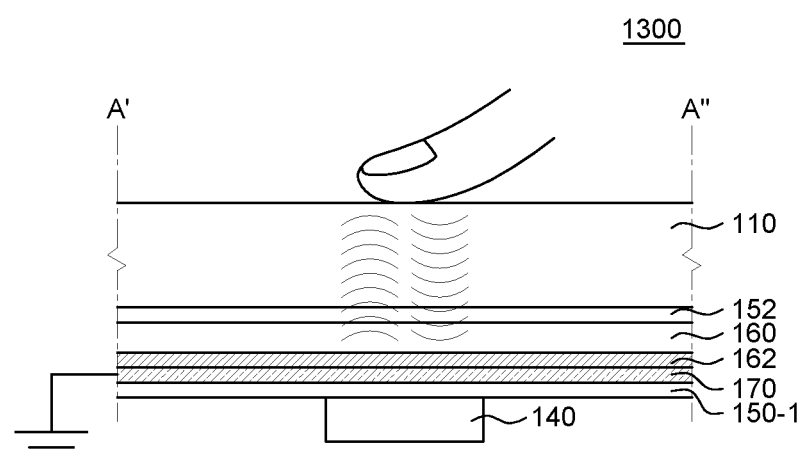
FIG. 17 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 17 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1300 according to the other embodiment of the present disclosure and the display devices 500, 1000 according to the other embodiments of the present disclosure may be omitted merely for the sake of convenience of explanation.

The features of the electroluminescence display panel 110, the fingerprint sensor 140, the support substrate 160, the first adhesive member 150-1, the second adhesive member 152, the light-shield member 162, and the EMI shield member 170 of the display device 1100 according to the other embodiment of the present disclosure may be implemented substantially the same as the features of the electroluminescence display panel 110, the fingerprint sensor 140, the support substrate 160, the first adhesive member 150-1, the second adhesive member 152, the light-shield member 162, and the EMI shield member 170 of the display devices 500, 1000 according to the other embodiments of the present disclosure. Thus, the redundant descriptions may be omitted merely for convenience of explanation.

The display device 1300 according to the other embodiment of the present disclosure may be configured to include the light-shield member 162 and the EMI shield member 170 which are sequentially stacked between the support substrate 160 and the fingerprint sensor 140. That is, the EMI shield member 170 is under the rear surface of the light-shield member 162.

The image quality degradation due to the external light due to the EMI shield member 170 can be suppressed by the light-shield member 162 disposed between the EMI shield member 170 and the electroluminescence display panel 110. At the same time, the electromagnetic interference noise generated between the fingerprint sensor 140 and the electroluminescence display panel 110 is shielded by the EMI shield member 170, thereby improving the fingerprint sensing performance of the fingerprint sensor 140 and the image quality of the electroluminescence display panel 110 at the same time.

In addition, since the first adhesive member 150-1 can be provided in other areas except for the fingerprint sensor 140, components other than the fingerprint sensor 140 also can be adhered.

Figure 18:
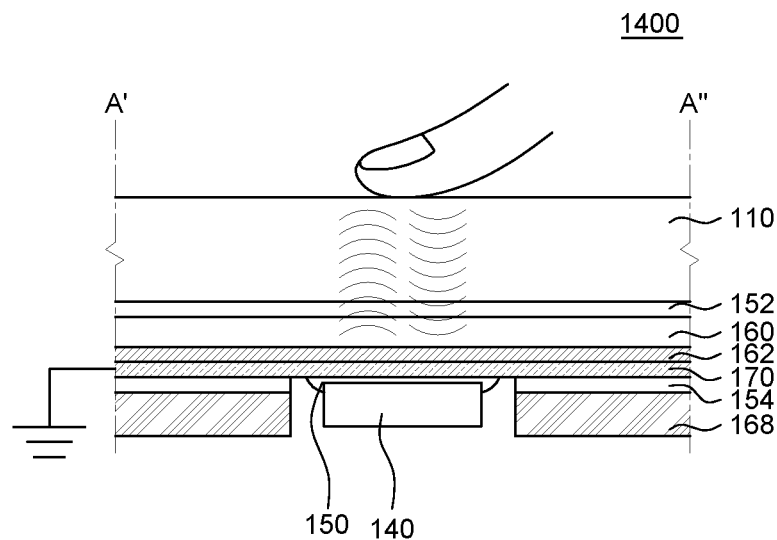
FIG. 18 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 18 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1400 according to the other embodiment of the present disclosure and the display devices 800, 1200 according to the other embodiments of the present disclosure may be omitted merely for the sake of convenience of explanation.

The features of the electroluminescence display panel 110, the fingerprint sensor 140, the support substrate 160, the first adhesive member 150, the second adhesive member 152, the light-shield member 162, the cushion member 168, and the EMI shield member 170 of the display device 1400 according to the other embodiment of the present disclosure may be implemented substantially the same as the features of the electroluminescence display panel 110, the fingerprint sensor 140, the support substrate 160, the first adhesive member 150, the second adhesive member 152, the light-shield member 162, the cushion member 168, and the EMI shield member 170 of the display devices 800, 1200 according to the other embodiments of the present disclosure. Thus, the redundant descriptions may be omitted merely for convenience of explanation.

The inventors of the present disclosure have recognized that when the cushion member 168 is configured to surround the fingerprint sensor 140 and the third adhesive member 154, arranged between the cushion member 168 and the EMI shield member 170, configured to surround the fingerprint sensor 140 may not affect in the ultrasonic transmission and reception channel of the fingerprint sensor 140. Thus, it is recognized that the ultrasonic transmission characteristics may be ignored. That is, the third adhesive member 154, which can be disposed in an area other than the ultrasonic transmission and reception channel of the fingerprint sensor 140, does not substantially affect the ultrasonic transmission and reception channel. Therefore, the Young's modulus value and the thickness of the third adhesive member 154 may not be limited.

Accordingly, the display device 1400 according to the other embodiment of the present disclosure may be configured to include the third adhesive member 154 disposed between the cushion member 168 and the EMI shield member 170.

According to the above-described configuration, the problem of deterioration in image quality due to external light due to the EMI shield member 170 can be suppressed by the light-shield member 162 disposed between the EMI shield member 170 and the electroluminescence display panel 110. Further, unnecessary dispersion of ultrasonic waves from the fingerprint sensor 140 can be absorbed by the cushion member 168. Further, the electromagnetic interference noise generated between the fingerprint sensor 140 and the electroluminescence display panel 110 can be shielded by the EMI shield member 170. Furthermore, the Young's modulus and the thickness of the third adhesive member 154 may not be limited thereto.

In some cases, the cushion member 168 and the EMI shield member 170 may be realized as an integrated member. That is, the integrated member may be realized as a single film or layer that integrates a cushion function and an EMI shielding function together. That is, the position, thickness, area, material, and the like of the integrated member may be variously modified according to the type, size, use environment, purpose of use, and the like of the display device including the fingerprint sensor 140.

Figure 19:
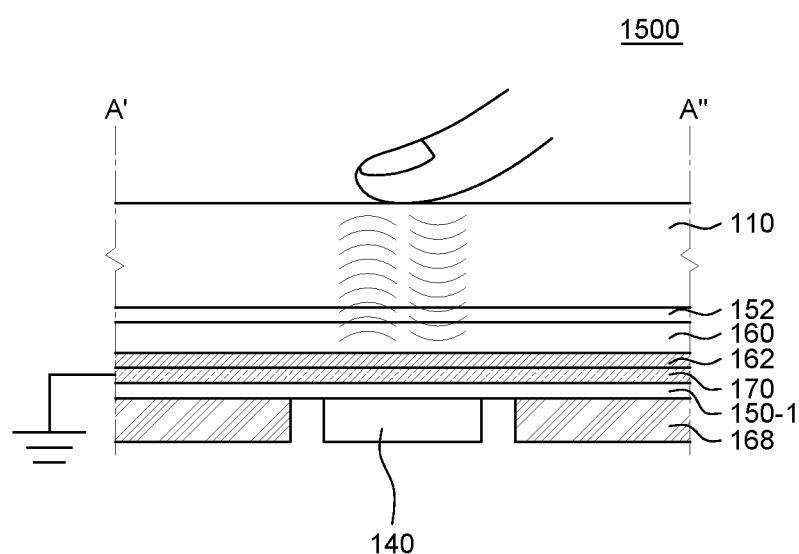
FIG. 19 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 19 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 1500 according to the other embodiment of the present disclosure and the display devices 800, 1300 according to the other embodiments of the present disclosure may be omitted merely for the sake of convenience of explanation.

The features of the electroluminescence display panel 110, the fingerprint sensor 140, the support substrate 160, the first adhesive member 150-1, the second adhesive member 152, the light-shield member 162, the cushion member 168, and the EMI shield member 170 of the display device 1500 according to the other embodiment of the present disclosure may be implemented substantially the same as the features of the electroluminescence display panel 110, the fingerprint sensor 140, the support substrate 160, the first adhesive member 150-1, the second adhesive member 152, the light-shield member 162, the cushion member 168, and the EMI shield member 170 of the display devices 800, 1300 according to the other embodiments of the present disclosure. Thus, the redundant descriptions may be omitted merely for convenience of explanation.

A display device 1500 according to the other embodiment of the present disclosure may include a light-shield member 162, an EMI shield member 170, a first adhesive member 150-1 and a cushion member 168 configured to surround the fingerprint sensor 140.

According to the above-described configuration, the problem of deterioration in image quality due to external light due to the EMI shield member 170 can be suppressed by the light-shield member 162 disposed between the EMI shield member 170 and the electroluminescence display panel 110. Further, unnecessary transmission of ultrasonic waves from the fingerprint sensor 140 can be reduced by the cushion member 168 and electromagnetic interference between the fingerprint sensor 140 and the electroluminescence display panel 110 can be shielded by the EMI shield member 170. Since the first adhesive member 150-1 can be provided in a periphery area of the fingerprint sensor 140, components other than the fingerprint sensor 140 can be adhered.

Figure 20:
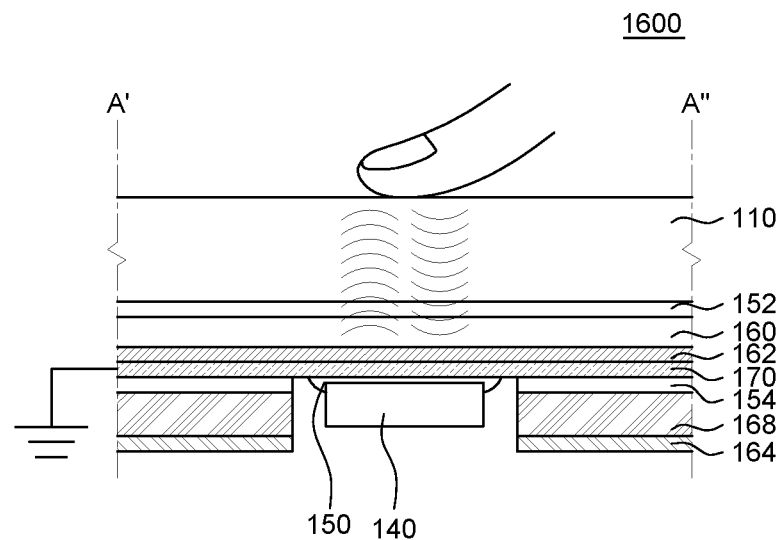
FIG. 20 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 21:
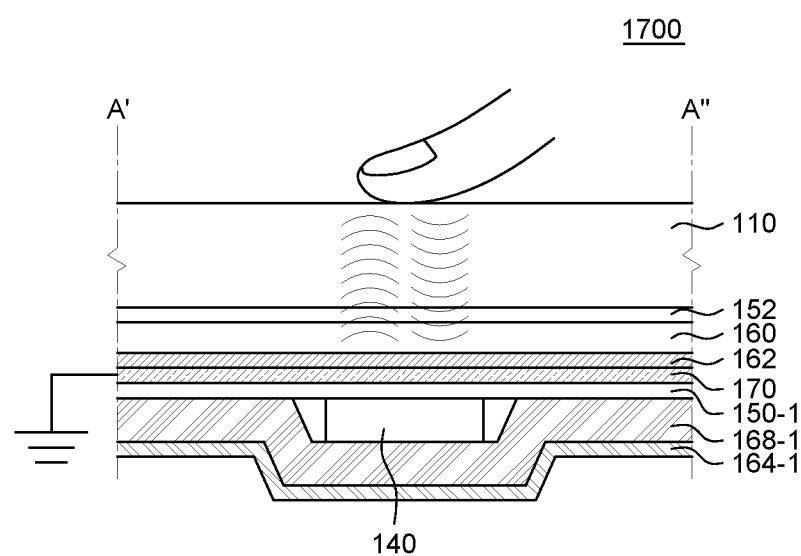
FIG. 21 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 22:
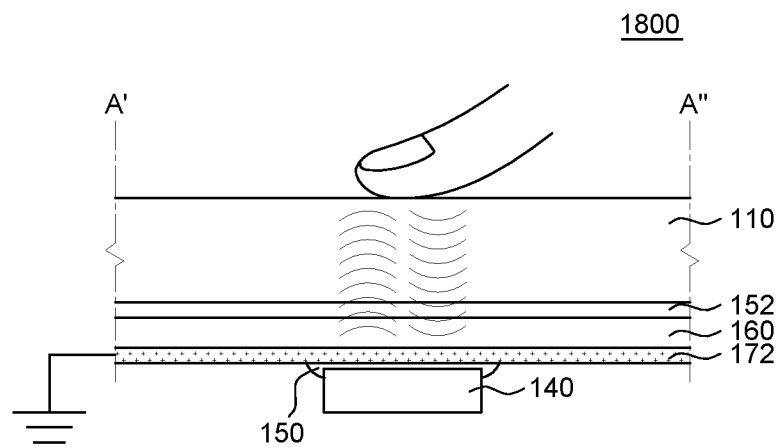
FIG. 22 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 23:
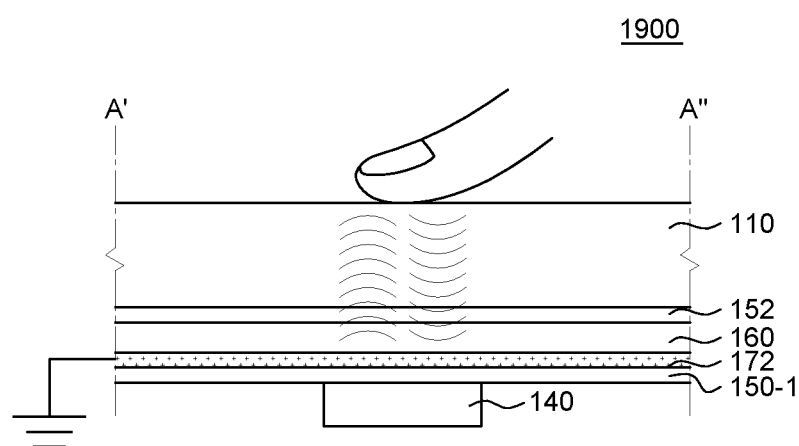
FIG. 23 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 24:
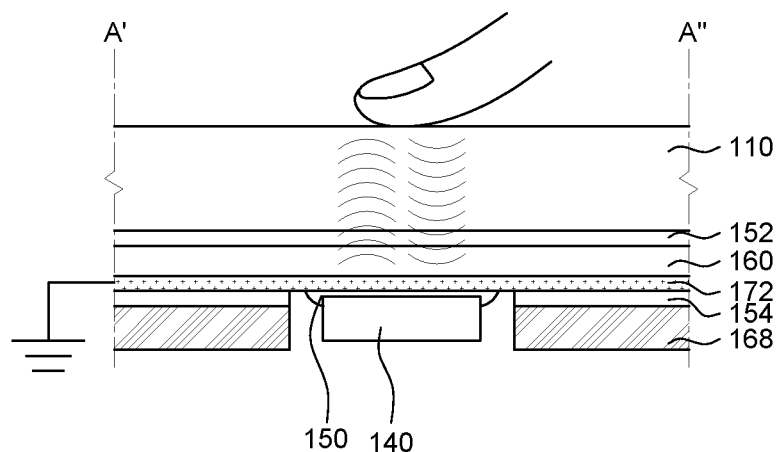
FIG. 24 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 25:
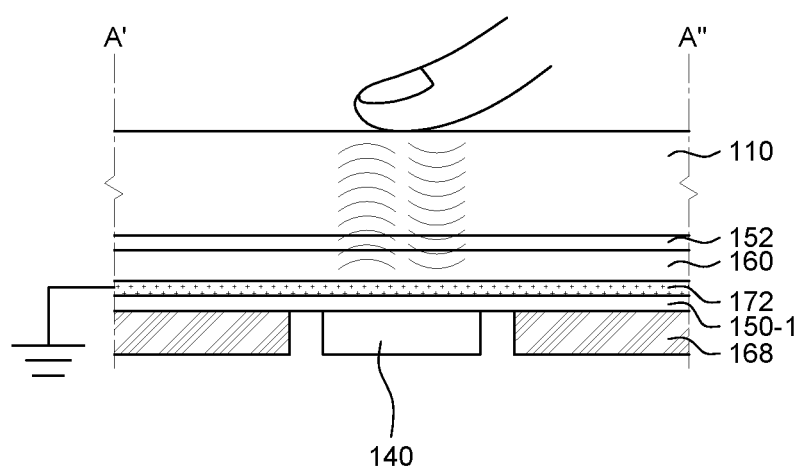
FIG. 25 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 26:
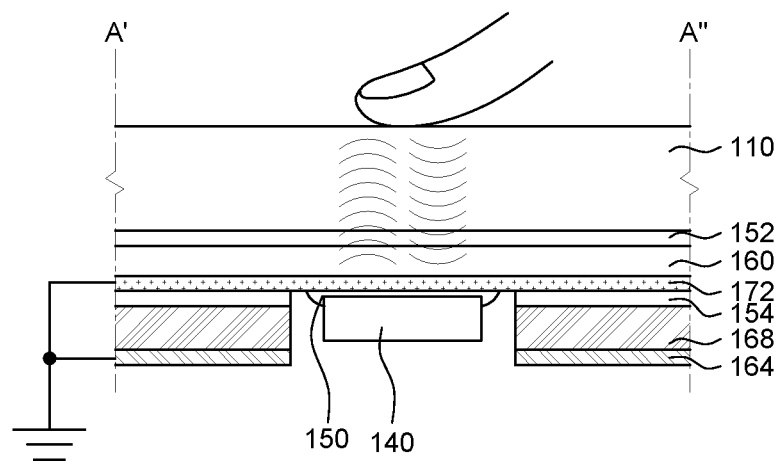
FIG. 26 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 20 and FIG. 21 are cross-sectional views schematically illustrating a cross section A'-A" corresponding to a fingerprint recognition area of a display device including an electroluminescence display panel capable of providing a fingerprint recognition function according to the other embodiments of the present disclosure.

Redundant features of the display devices 1600, 1700 according to the other embodiments of the present disclosure and the display devices 700, 800, 900, 1400 according to the other embodiments of the present disclosure may be omitted merely for the sake of convenience of explanation.

The features of the electroluminescence display panel 110, the fingerprint sensor 140, the support substrate 160, the first adhesive member 150, 150-1, the second adhesive member 152, the light-shield member 162, the heat dissipation member 164, 164-1, the cushion member 168, and the EMI shield member 170 of the display devices 1600, 1700 according to the other embodiments of the present disclosure may be implemented substantially the same as the features of the electroluminescence display panel 110, the fingerprint sensor 140, the support substrate 160, the first adhesive member 150, 150-1, the second adhesive member 152, the light-shield member 162, the heat dissipation member 164, 164-1, the cushion member 168, and the EMI shield member 170 of the display devices 800, 1300 according to the other embodiments of the present disclosure. Thus, the redundant descriptions may be omitted merely for convenience of explanation.

The display device 1600 according to the other embodiment of the present disclosure is characterized in that the heat dissipation member 164 is disposed under the rear side of the cushion member 168.

The display device 1700 according to the other embodiment of the present disclosure, the cushion member 168-1 is configured to cover the display area and the fingerprint sensor 140, and the heat dissipation member 164-1 is configured to correspond to the cushion member 168-1 under the rear surface of the cushion member 168-1.

According to the above-described configuration, a generation of shadow-mura problem can be suppressed, an electromagnetic interference noise can be shielded, an impact applied to the fingerprint sensor 140 can be absorbed, and an unnecessary transmission of ultrasonic waves from the fingerprint sensor 140 can be reduced.

In addition, the ultrasonic waves output from the fingerprint sensor 140 can be transmitted toward to the rear side of the fingerprint sensor. Referring to FIG. 21, when the cushion member 168-1 is configured to cover the rear side of the fingerprint sensor 140, a portion of the ultrasonic wave transmitted toward a frame disposed under the rear surface of the fingerprint sensor 140 for supporting a system circuitry and an electroluminescence display panel 110 can be absorbed by the cushion member 168-1. Therefore, unnecessary transmission of the ultrasonic waves of the fingerprint sensor 140 toward the rear side can be reduced.

In some embodiments, the cushion member may be separated into a plurality of pieces, and a cushion member composed of a plurality of pieces may be configured to surround the fingerprint sensor 140.

In some cases, the cushion member 168-1 and the heat dissipation member 164-1 may be realized as an integrated member. That is, the integrated member may be realized as a single film or layer that integrates a cushion function and a heat sinking function together. That is, the position, thickness, area, material, and the like of the integrated member may be variously modified according to the type, size, use environment, purpose of use, and the like of the display device including the fingerprint sensor 140.

FIG. 22 to FIG. 27 are cross-sectional views schematically illustrating a cross section A'-A" corresponding to a fingerprint recognition area of a display device including an electroluminescence display panel capable of providing a fingerprint recognition function according to the other embodiments of the present disclosure.

Redundant features of the display devices 1800, 1900, 2000, 2100, 2200, 2300 according to the other embodiments of the present disclosure and the display devices as illustrated in FIG. 1 to FIG. 21 according to the other embodiments of the present disclosure may be omitted merely for the sake of convenience of explanation.

The display devices 1800, 1900, 2000, 2100, 2200, 2300 according to the embodiments of the present disclosure may include a light and EMI shield member 172, for shielding external light and electromagnetic interference noise, disposed between the electroluminescence display panel 110 and the fingerprint sensor 140.

The light and EMI shield member 172 may refer to a multi-functional member configured to perform the functions of the light-shield member 162 and the EMI shield member 170. Further, the light and EMI shield member 172 may be applied as an alternative embodiment for some embodiments to which the light-shield member 162 and the EMI shield member 170 are applied.

According to the above-described configuration, the embodiments including the light-shield member 162 and the EMI shield member 170 may be embodied as alternative embodiments in which the light and EMI shield member 172 is substituted, thereby reducing the cost.

The light and EMI shield member 172 may be configured to have a light absorbing property and a conductivity at the same time. For example, the light and EMI shield member 172 may include graphite, carbon, graphene, metal particles, and the like. The light and EMI shield member 172 may have a visible light absorption rate of 80% or more and a sheet resistance of 30 Ω/Sq/mil or less. The thickness of the light and EMI shield member 172 may be 50 nm to 300 nm. However, the present disclosure is not limited thereto. If the thickness of the light and EMI shield member 172 is 300 nm or more, the shielding performance may be deteriorated. If the thickness of the light and EMI shield member 172 is less than 50 nm, the visible light absorption rate may be lowered.

According to the above-described configuration, the light and EMI shield member 172 can be applied to minimize the decrease in the signal sensitivity of the ultrasonic transmission and reception channel while minimizing the thickness increase of the display device. Further, it is possible to suppress the occurrence of shadow-mura. Further, it is possible to shield the electromagnetic interference noise to improve the performance of the fingerprint sensor 140 and to minimize the deterioration of the image quality of the electroluminescence display panel 110.

In addition, the fingerprint sensor 140 may be attached to the light and EMI shield member 172 by the first adhesive member 150 or the first adhesive member 150-1.

In addition, the fingerprint sensor 140 may suppress undesired dispersion of ultrasonic waves by the cushion member 168 under the rear side of the light and EMI shield member 172.

The heat dissipation member 164, which may be included in various embodiments of the present disclosure, may be grounded. The light and EMI shield member 172 and the heat dissipation member 164, which may be included in the various embodiments of the present disclosure, may be respectively grounded. The heat dissipation member 164, which may be included in various embodiments of the present disclosure, may be electrically connected to the light and EMI shield member 172. However, the present disclosure is not limited thereto, and it is possible that the EMI shield member 170 and the light-shield member 162 are electrically connected to each other.

According to the above-described configuration, when the heat dissipation member 164 and the light and EMI shield member 172 may be electrically connected to each other, the potential difference may not be generated between the heat dissipation member 164 and the light and EMI shield member 172 when they are grounded. Therefore, the parasitic capacitance can be reduced. In addition, unnecessary noise signals can be grounded.

Figure 27:
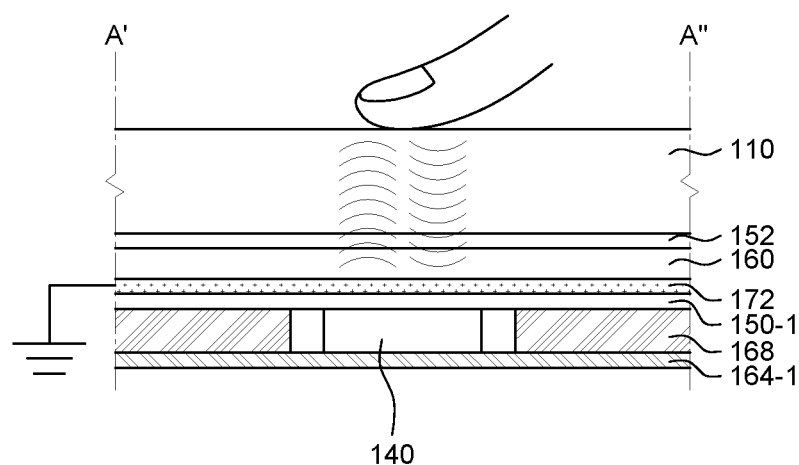
FIG. 27 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 28:
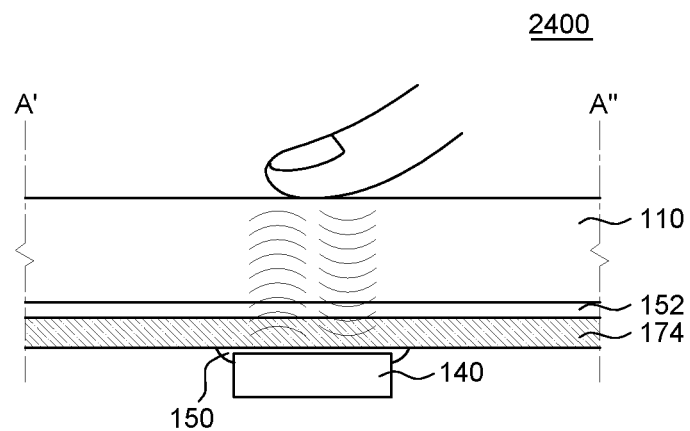
FIG. 28 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 29:
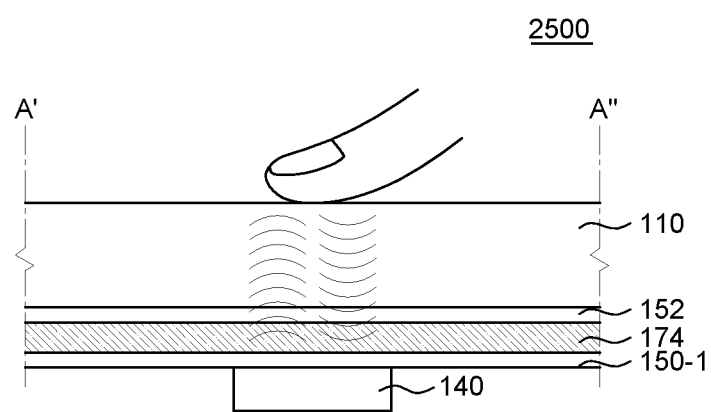
FIG. 29 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 30:
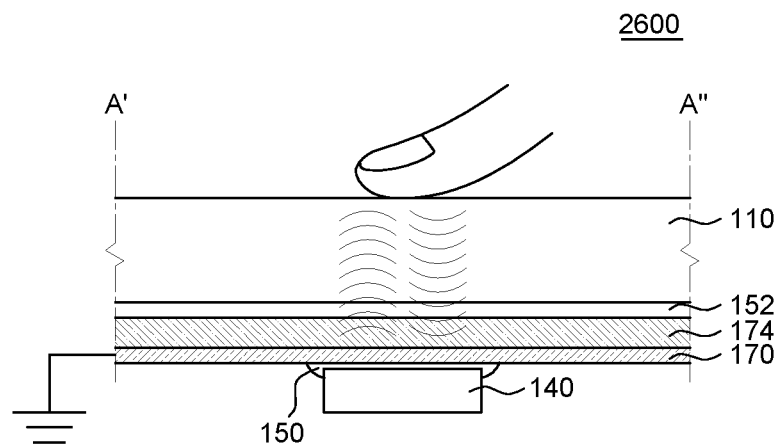
FIG. 30 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 31:
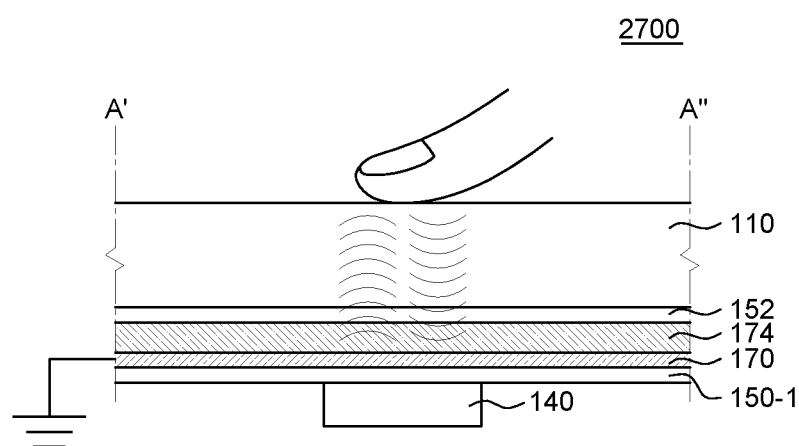
FIG. 31 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 32:
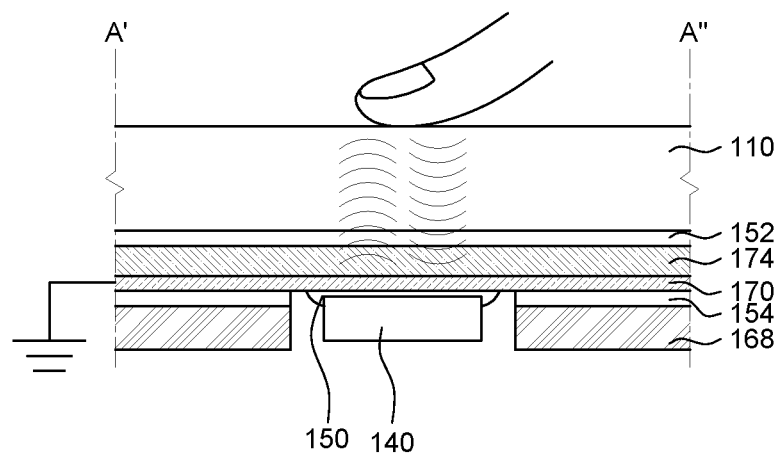
FIG. 32 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 33:
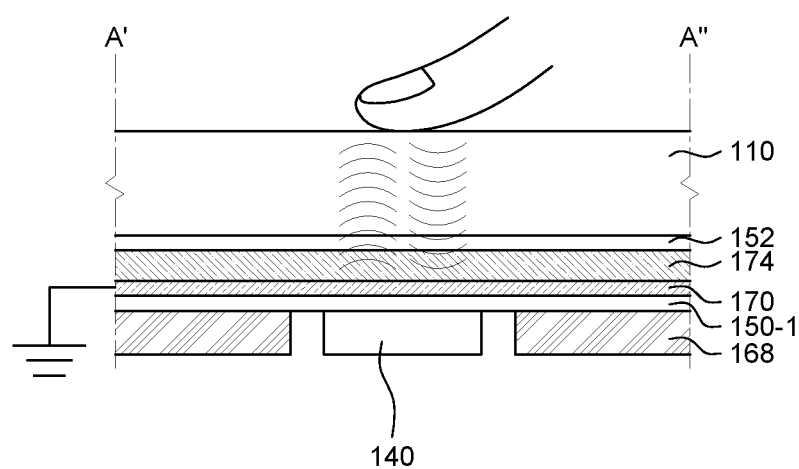
FIG. 33 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 34:
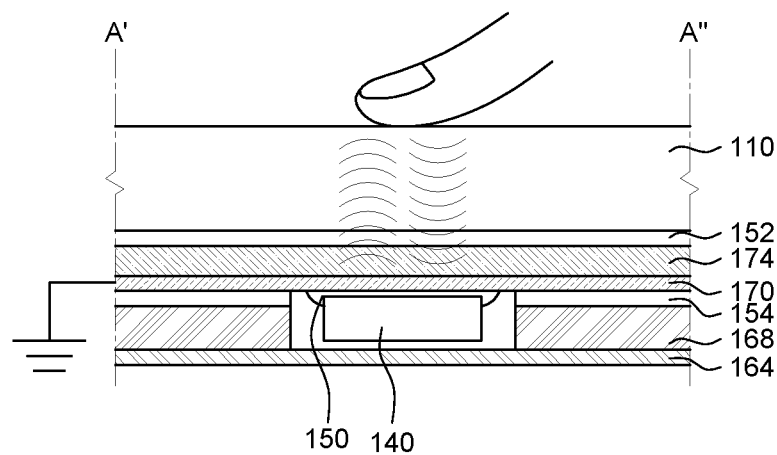
FIG. 34 is a cross-sectional view schematically illustrating a cross section A'-A" corresponding to a fingerprint recognition area of a display device including an electroluminescence display panel capable of providing a fingerprint recognition function according to the other embodiment of the present disclosure.
Figure 35:
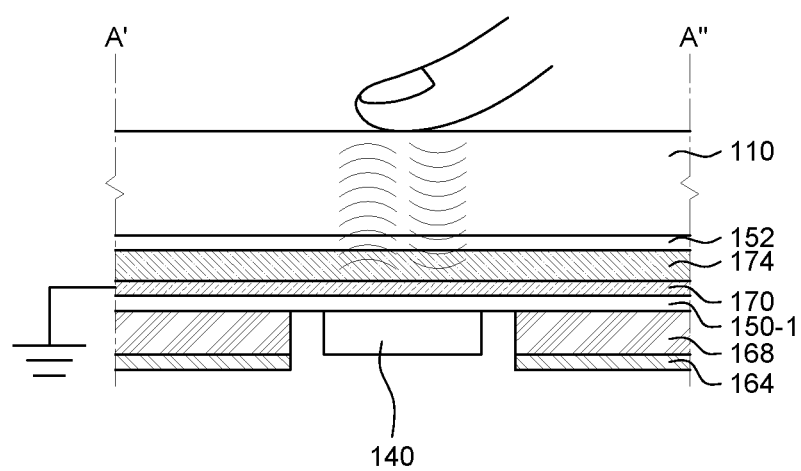
FIG. 35 is a cross-sectional view schematically illustrating a cross section A'-A" corresponding to a fingerprint recognition area of a display device including an electroluminescence display panel capable of providing a fingerprint recognition function according to the other embodiment of the present disclosure.

In addition, referring to FIG. 27, the light and EMI shield member 172 and the heat dissipation member 164 are illustrated as being grounded, but the present disclosure is not limited thereto, and in various embodiments. For example, it is also possible that the members having shielding ability and the members having heat-sinking ability with a conductivity of the display devices 1600, 1700, 2300, 3000, 3100 can be grounded to each other.

FIG. 28 to FIG. 35 are cross-sectional views schematically illustrating a cross section A'-A" corresponding to a fingerprint recognition area of a display device including an electroluminescence display panel capable of providing a fingerprint recognition function according to the other embodiments of the present disclosure.

Redundant features of the display devices 2400, 2500, 2600, 2700, 2800, 2900, 3000, 3100 according to the other embodiments of the present disclosure and the display devices as illustrated in FIG. 1 to FIG. 27 according to the other embodiments of the present disclosure may be omitted merely for the sake of convenience of explanation.

The display devices 2400, 2500, 2600, 2700, 2800, 2900, 3000, 3100 according to the embodiments of the present disclosure may include a light-shield support substrate 174 disposed between the electroluminescence display panel 110 and the fingerprint sensor 140.

The light-shield support substrate 174 refers to a support substrate having a visible light-absorbing function configured to perform the functions of the light-shielding member 162 and the support substrate 160. The light-shield support substrate 174 may be alternatively applied to which the support substrate 160 and the light-shielding member 162 are applied.

The display device according to embodiments of the present disclosure may include an electroluminescence display panel 110, a fingerprint sensor 140 disposed below the rear side of the electroluminescence display panel 110, and a light-shield support substrate 174, positioned between the electroluminescence display panel 110 and the fingerprint sensor 140, configured to absorb external light that is transmitted through the electroluminescence display panel 110 and reflected by the fingerprint sensor 140.

The display device according to the embodiments of the present disclosure may include an electroluminescence display panel 110 comprising a plurality of pixels formed on a flexible substrate having a Young's modulus of 2.5 GPa to 3.5 GPa, a fingerprint sensor 140 under the electroluminescence display panel 110, and a light-shield support substrate 174, positioned between the electroluminescence display panel 110 and the fingerprint sensor 140, configured to absorb at least a portion external light pass through the electroluminescence display panel 110, and configured to reduce a flatness degradation of the electroluminescence display panel 110 due to a stress exerted by an adhesive member that bonds the fingerprint sensor 140.

According to the above-described configuration, alternative embodiments having the light-shield support substrate 174 may be embodied to substitute the embodiments including the support substrate 160 and the light-shielding member 162, thereby reducing the manufacturing process and the manufacturing cost.

The light-shield support substrate 174 can improve the flatness of the electroluminescence display panel 110. The light-shield support substrate 174 may be, for example, light absorbing polyethylene terephthalate (PET). In other words, the Young's modulus of the exemplary light-shield support substrate 174 may be approximately 2.5 GPa to 3.5 GPa. However, the present disclosure is not limited thereto. For example, when the light-shield support substrate 174 is polyethylene terephthalate, the thickness may be 50 μm to 200 μm. In addition, since the light-shield support substrate 174 may be configured to perform the support function and the light-shielding function simultaneously. Accordingly, the thickness of the support substrate 160 according to some embodiments may be thicker. However, the present disclosure is not limited thereto.

The light-shield support substrate 174 may be converted into a transparent or opaque state. That is, the light-shield support substrate 174 may include a material whose optical light-shielding property or visible light transmittance is variable under specific conditions. However, the present disclosure is not limited thereto.

When the transparency of the light-shield support substrate 174 can be varied, a transparent state can be utilized during the manufacturing process.

For example, at the time of manufacturing the electroluminescence display panel 110, an inspection for various defects such as wiring failure of the electroluminescence display panel 110 can be processed, if the light-shield support substrate 174 is in a transparent state when the light-shield support substrate 174 is bonded to the electroluminescence display panel 110.

When the transparency of the light-shield support substrate 174 can be varied, the opaque state can be utilized after the manufacturing process.

For example, the light-shield support substrate 174 may become opaque after the inspection is completed. Therefore, after the defect inspection, the light-shield support substrate 174 can have a light-shielding characteristic. Thus, it can function as a light-shielding member.

The light-shield support substrate 174 may be configured to include a temperature-reactive or photo-reactive material. That is, the light-shield support substrate 174 may include a temperature-reactive material, and the light-shield support substrate 174 may be heat-treated at a predetermined threshold temperature or more to change the visible light absorption rate. For example, the thermo-chromatic material included in the light-shield support substrate 174 can vary in visible light absorption rate when heated above the predetermined threshold temperature, thereby changing the color from transparent to opaque. The light-shield support substrate 174 may have a visible light absorption rate of 80% or more. However, the present disclosure is not limited thereto.

For example, the photo-chromatic material included in the light-shield support substrate 174 can be turned from transparent to black when exposed to light of a particular wavelength. The light-shield support substrate 174 may have a visible light absorption rate of 80% or more. However, the present disclosure is not limited thereto.

According to the above-described configuration, the thickness increase of the display device can be minimized, the degradation in signal sensitivity of the ultrasonic transmission and reception channel can be minimized, the generation of shadow-mura can be suppressed, and the flatness of the electroluminescence display panel 110 can be maintained by using the light-shield support substrate 174.

In addition, the fingerprint sensor 140 can suppress undesired diffusion of ultrasonic waves by the cushion member 168 disposed under the rear side of the light and EMI shield member 172.

Figure 36:
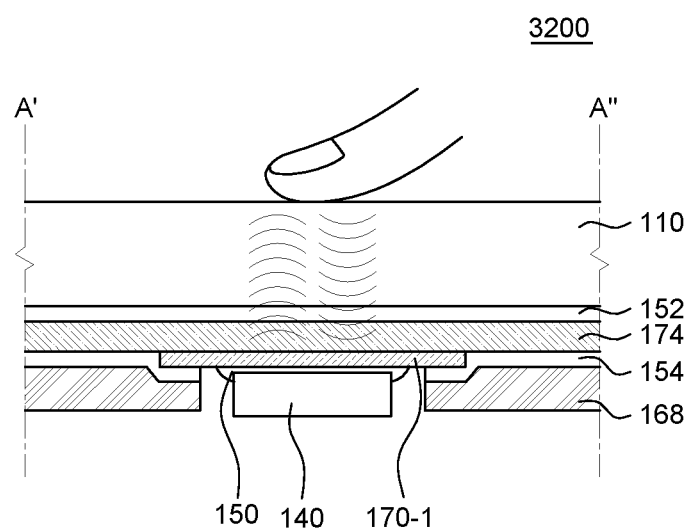
FIG. 36 is a cross-sectional view schematically illustrating a cross section A'-A" corresponding to a fingerprint recognition area of a display device including an electroluminescence display panel capable of providing a fingerprint recognition function according to the other embodiment of the present disclosure.

FIG. 36 is a cross-sectional view schematically illustrating a cross section A'-A" corresponding to a fingerprint recognition area of a display device including an electroluminescence display panel capable of providing a fingerprint recognition function according to the other embodiment of the present disclosure.

Redundant features of the display device 3200 according to the other embodiment of the present disclosure and the display devices as illustrated in FIG. 1 to FIG. 35 according to the other embodiments of the present disclosure may be omitted merely for the sake of convenience of explanation.

The display device 3200 according to the other embodiment of the present disclosure may include the light-shield support substrate 174 disposed under the rear side of the electroluminescence display panel 110 and the EMI shield member 170-1 disposed under the rear side of the light-shield support substrate 174.

The EMI shield member 170-1 may be configured to shield the fingerprint sensor 140 by overlapping with the fingerprint sensor 140. That is, the EMI shield member 170-1 may be configured to cover at least the fingerprint sensor 140. The EMI shield member 170-1 may be configured to have a light-shield ability.

In addition, the heat dissipation member 164 may be arranged under the rear side of the light-shield support substrate 174 to cover the outer periphery of the EMI shield member 170-1. That is, the EMI shield member 170-1 may be configured to overlap the opening of the cushion member 168 to shield the rear side of the electroluminescence display panel 110 corresponding to the area where the fingerprint sensor 140 is disposed. Further, the cushion member 168 may be formed of a light-shielding foam tape. Further, the rear side of the electroluminescence display panel 110 may be completely shielded, and at least the fingerprint recognition area FDA can be shielded.

According to the above-described configuration, the image quality degradation, for example, shadow-mura due to external light can be suppressed by the light-shielding member 162-1 and the cushion member 168.

In other words, the cushion member 168 may be configured to cover a portion of the outer periphery of the heat dissipation member 164.

According to the above-described configuration, the light-shield support substrate 174 between the EMI shield member 170-1 and the electroluminescence display panel 110 can suppress image quality deterioration due to external light caused by the EMI shield member 170-1. For example, shadow-mura can be suppressed. In addition, heat generated from the fingerprint sensor 140 can be effectively dissipated. According to the above-described configuration, the EMI shield member 170-1 and the cushion member 168 can suppress the image quality degradation caused by external light. In the above-described configuration, when the EMI shield member 170-1 shields at least the fingerprint sensor 140, most of the electromagnetic interference noise can be suppressed.

Figure 37:
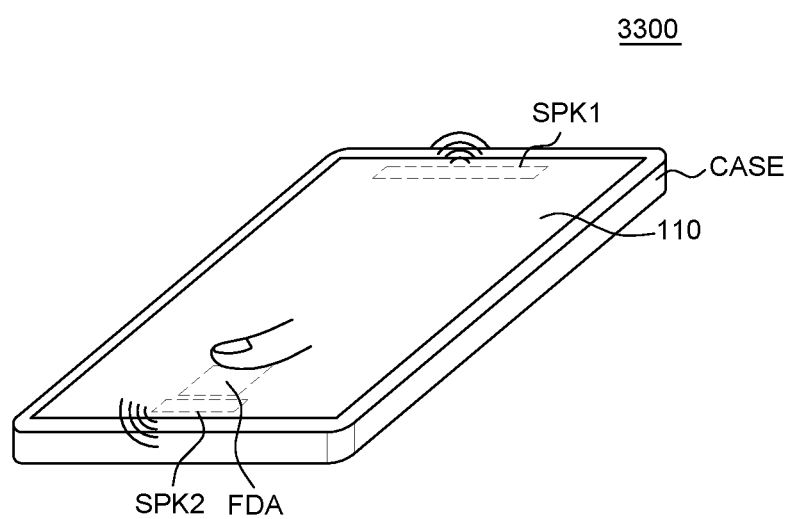
FIG. 37 is a conceptual diagram schematically illustrating a display device capable of providing a fingerprint recognition function, a pressure sensing function, and a speaker function according to the other embodiment of the present disclosure.

FIG. 37 is a conceptual diagram schematically illustrating a display device capable of providing a fingerprint recognition function, a pressure sensing function, and a speaker function according to the other embodiment of the present disclosure.

Redundant features of the display device 3300 according to the other embodiment of the present disclosure and the display device 100 according to an embodiment of the present disclosure may be omitted merely for the sake of convenience of explanation.

Referring to FIG. 37, a display device 3300 according to the other embodiment of the present disclosure will be described.

The display device 3300 according to the other embodiment of the present disclosure may include an electroluminescence display panel 110 and a case supporting the electroluminescence display panel 110.

The display area of the electroluminescence display panel 110 of the display device 3300 can be maximized by removing the conventional speakers 12, 13.

The display device 3300 according to the other embodiment of the present disclosure may include at least one speaker capable of outputting sound through the electroluminescence display panel 110. For example, a first speaker SPK1 and a second speaker SPK2 are disposed under the rear side of the electroluminescence display panel 110. Accordingly, at least one speaker can be integrated with the electroluminescence display panel 110.

The fingerprint recognition area FDA may be configured to recognize fingerprint recognition and the pressure of the user's finger.

Figure 38:
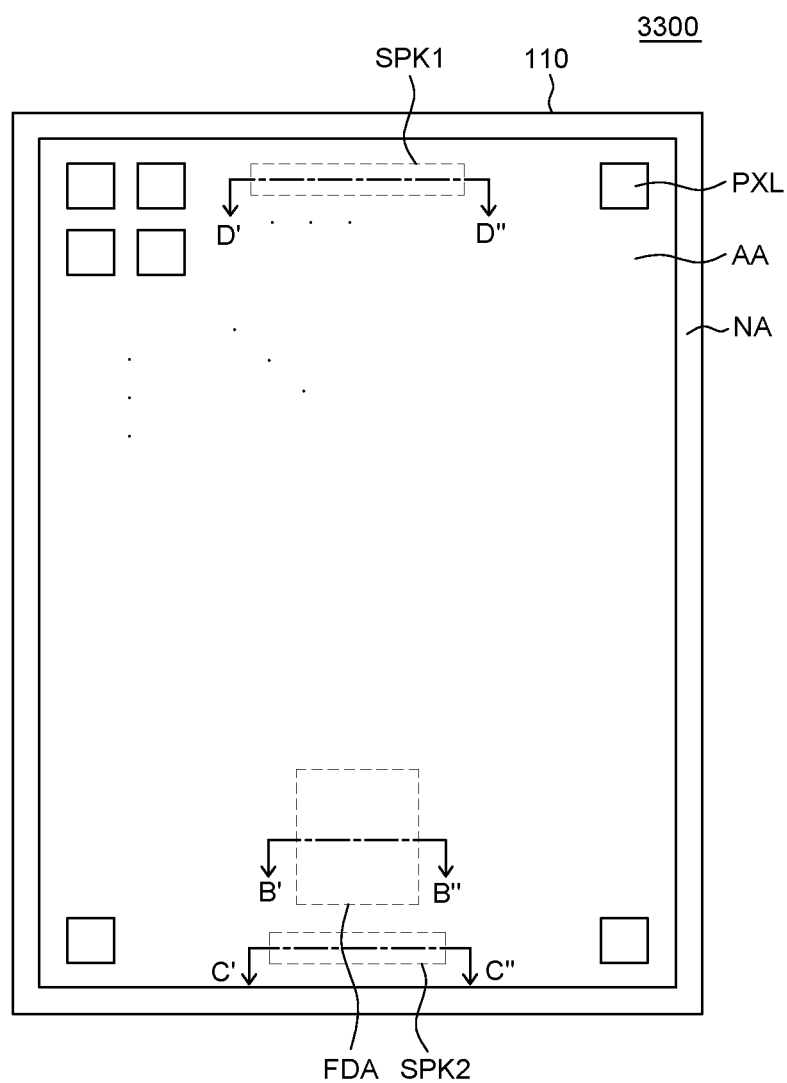
FIG. 38 is a plan view schematically illustrating an electroluminescence display panel of a display device capable of providing a fingerprint recognition function, a pressure sensing function, and a speaker function according to the other embodiment of the present disclosure.

FIG. 38 is a plan view schematically illustrating an electroluminescence display panel of a display device capable of providing a fingerprint recognition function, a pressure sensing function, and a speaker function according to the other embodiment of the present disclosure.

Redundant features of the display device 3300 according to the other embodiment of the present disclosure and the display device 100 according to an embodiment of the present disclosure may be omitted merely for the sake of convenience of explanation.

Referring to FIG. 38, an electroluminescence display panel 110 of the display device 3300 according to the other embodiment of the present disclosure will be described.

Ultrasonic waves generated from the fingerprint sensor can be transmitted to the fingerprint recognition area FDA set in the display area AA to enable fingerprint recognition. The degree of pressure of the user's finger can be recognized. Thus, it is also possible to distinguish the degrees of the pressure. Although only one fingerprint recognition area is illustrated in FIG. 38, the present disclosure is not limited thereto. In addition, a plurality of fingerprint recognition areas can be arranged.

For example, the two fingerprint recognition areas can be arranged symmetrically with respect to the center of the display area. According to the above-described arrangement, even if the display area AA is rotated 180 degrees, the same user experience can be provided that can perform the fingerprint recognition function at substantially the same position with respect to the user. That is, the same user experience can be provided regardless of which direction the user holds the display device.

In the speaker areas SPK1 and SPK2 set in the display area AA, the sound generated from the film-type speaker disposed under the rear side of the electroluminescence display panel 110 is transmitted to the front side of the electroluminescence display panel 110 to output sound.

For example, two speaker areas can be arranged symmetrically with respect to the center of the pixel area. According to the above-described configuration, even if the display area AA rotates 180 degrees, an user experience can be provided with an acoustic experience at substantially the same position.

For example, a plurality of speaker areas may be arranged within a display area at specific distances to output multi-channel sound.

Figure 39A:
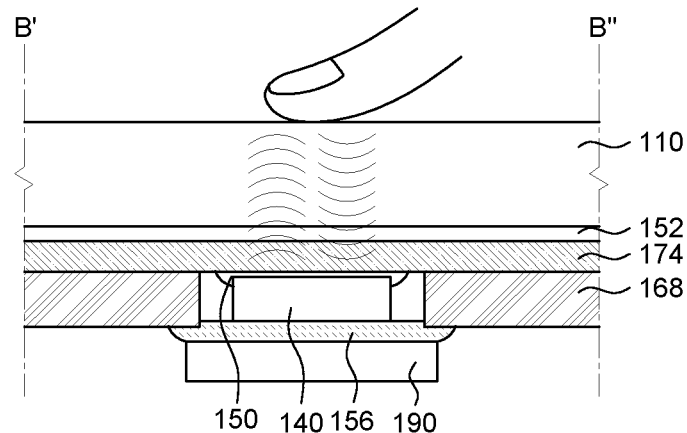
FIGS. 39A, 39B, and 39C are cross-sectional views schematically illustrating a cross section B'-B" corresponding to a fingerprint recognition area of a display device including an electroluminescence display panel capable of providing a fingerprint recognition function, a pressure sensing function, and a speaker function according to the other embodiment of the present disclosure.

FIG. 39A is a cross-sectional view schematically illustrating a cross section B'-B" corresponding to a fingerprint recognition area of a display device including an electroluminescence display panel capable of providing a fingerprint recognition function, a pressure sensing function, and a speaker function according to the other embodiment of the present disclosure.

Redundant features of the display device 3300A according to the other embodiment of the present disclosure and the display devices as illustrated in FIG. 1 to FIG. 36 according to the other embodiments of the present disclosure may be omitted merely for the sake of convenience of explanation.

The electroluminescence display panel 110 of the display device 3300A according to the other embodiment of the present disclosure may include a substrate, configured to act as an ultrasonic transmission and reception channel of a fingerprint sensor 140, a transistor on the substrate, an electroluminescence element on the transistor, and an encapsulation unit on the electroluminescence element.

The display device 3300A according to the other embodiment of the present disclosure may include a fingerprint sensor 140 under the rear side of the electroluminescence display panel 110 and a pressure sensor 190 under the rear side of the fingerprint sensor 140. The fingerprint sensor 140 may be configured to transmit ultrasonic waves to a fingerprint and receive the reflected ultrasonic waves to recognize fingerprints touched on the fingerprint recognition area FDA.

The display device 3300A according to the other embodiment of the present disclosure may include a display area AA including a fingerprint recognition area FDA, a plurality of pixels PXL disposed on a substrate of an electroluminescence display panel 110, an ultrasonic fingerprint sensor 140 under a rear side of the substrate corresponding to the fingerprint recognition area FDA, and a pressure sensor 190 under the rear side of the fingerprint sensor 140. In addition, when the pressure sensor 190 is disposed under the rear side of the fingerprint sensor 140, the user's finger pressure can be detected more accurately in the fingerprint recognition area FDA. If the pressure sensor 190 does not overlap with the fingerprint sensor 140 or overlaps at least a portion of the fingerprint sensor 140, the pressure sensing sensitivity may be reduced during fingerprint recognition. If the pressure sensor 190 does not overlap with the fingerprint sensor 140, at least a portion is overlapped, or pressure is applied to an area other than the fingerprint recognition area FDA, the fingerprint sensor 140 may be operated unintentionally.

A display device 3300A according to the other embodiment of the present disclosure may include an electroluminescence display panel 110 configured to display an image, a fingerprint sensor 140 under the rear surface of the electroluminescence display panel 110, and a pressure sensor 190 under the rear side of the fingerprint sensor 140 and configured to detect a pressure that can be applied to the electroluminescent display panel 110. Further, the front surface of the fingerprint sensor 140 may be fixed to the rear surface of the electroluminescence display panel 110 by the first adhesive member 150. Furthermore, the rear surface of the fingerprint sensor 140 may be fixed to the pressure sensor 190 by the fourth adhesive member 156.

A display device 3300A according to the other embodiment of the present disclosure may include a plurality of pixels on a flexible substrate, a cushion member, under the flexible substrate, having at least one opening, at least one pressure sensor 190, under the cushion member 168, configured to receive pressure through a periphery of the at least one opening, and a fingerprint sensor 140 between the flexible substrate and the at least one pressure sensor 190. At least one pressure sensor 190 may be configured to receive at least a portion of the pressure through the corresponding at least one fingerprint sensor 140. At least one pressure sensor 190 may be configured to receive at least another portion of the pressure through a corresponding cushion member 168. In addition, when the pressure is transmitted only through the fingerprint sensor 140, the stress applied to the fingerprint sensor 140 may be increased. When the pressure is transmitted only through the cushion member 168, the pressure may be absorbed by the cushion member 168, and the pressure sensing precision may be reduced. The pressure sensor 190 may be realized by a resistance sensing type or a capacitance sensing type. However, the present disclosure is not limited thereto.

The light-shield support substrate 174 may be located between the substrate of the electroluminescence display panel 110 and the ultrasonic fingerprint sensor 140. However, as described above, it is also possible to implement using alternative configurations disclosed in the embodiments of the present disclosure. For example, the light-shield support substrate 174 may be substituted with the support substrate 160 of other embodiments. It is also possible that the light-shield member 162 is further disposed under the rear surface of the support substrate 160.

The cushion member 168 may be disposed under the rear side of the light-shield support substrate 174 and may be configured to surround the fingerprint sensor 140 with an opening formed therein. The thickness of the cushion member 168 may be configured to be substantially the same as the thickness of the fingerprint sensor 140 or may be configured to have a particular thickness that can minimize the step difference. However, the present disclosure is limited thereto. For example, if the fingerprint sensor 140 and the cushion member 168 have substantially the same thickness, the step difference between the fingerprint sensor 140 and the pressure sensor 190 can be reduced. Therefore, it may be easier for the pressure sensor 190 to be attached under the fingerprint sensor 140. The cushion member 168 may be configured to surround the fingerprint sensor 140 to absorb the ultrasonic output from the fingerprint sensor 140. The cushion member 168 may be disposed between the electroluminescence display panel 110 and the pressure sensor 190. Accordingly, it can be configured to transmit a portion of the pressure that can be transmitted from the electroluminescence display panel 110 to the pressure sensor 190.

The pressure sensor 190 may be configured to overlap at least a portion of the cushion member 168 and at least a portion of the fingerprint sensor 140. The area of the pressure sensor 190 may be larger than the area of the fingerprint sensor 140. The pressure sensor 190 and the fingerprint sensor 140 may be arranged to overlap with each other. The pressure sensor 190 may be disposed under the rear surface of the fingerprint sensor 140. In addition, it is preferable that the pressure sensor 190 is disposed under the rear surface of the fingerprint sensor 140 because the pressure sensor 190 does not sense the shape of a precise fingerprint such as a fingerprint. If the fingerprint sensor 140 is disposed under the pressure sensor 190, the sensitivity of the ultrasonic signal may be reduced and the fingerprint recognition rate or the fingerprint-sensing rate may be lowered.

The fourth adhesive member 156 may be configured to fix the fingerprint sensor 140, the pressure sensor 190, and the cushion member 168 at the same time. The pressure sensor 190 and the fingerprint sensor 140 can be adhered by the fourth adhesive member 156. The cushion member 168 and the pressure sensor 190 can be adhered by the fourth adhesive member 156. The pressure sensor 190 may be configured to be wider than the opening of the cushion member 168 and overlap with a portion of the cushion member 168 adjacent to the opening while overlapping with the fingerprint sensor 140.

The first adhesive member 150 and the fourth adhesive member 156 may be made of the same material. The first adhesive member 150 and the fourth adhesive member 156 may be made of materials different from each other. Since the first adhesive member 150 is a path for transmitting and receiving ultrasonic waves to and from the electroluminescence display panel 110, the Young's modulus and thickness of the first adhesive member 150 should be determined in consideration of ultrasonic transmission and reception characteristics. Since the fourth adhesive member 156 requires a Young's modulus capable of transmitting pressure to the pressure sensor 190, the Young's modulus and the thickness of the first adhesive member 152 may be less restrictive than those of the first adhesive member 152.

As the Young's modulus of the fourth adhesive member 156 is low or the thickness is thicker, the pressure transfer characteristics may be reduced. On the other hand, as the Young's modulus of the fourth adhesive member 156 is high or the thickness is thinner, the pressure transfer characteristics can be improved. However, the fourth adhesive member 156 may take into account not only the pressure transmission characteristic but also the shock absorption characteristic transmitted to the fingerprint sensor 140.

For example, when the Young's modulus of the fourth adhesive member 156 is low, when the impact is transmitted to the fingerprint sensor 140 through the electroluminescence display panel 110, the fingerprint sensor 140 may be damaged. In addition, the fingerprint sensor 140 may be made of a material having a high Young's modulus value suitable for generating ultrasonic waves for fingerprint recognition. In this case, it may be vulnerable to breakage. When the Young's modulus of the fourth adhesive member 156 is relatively lower than the Young's modulus of the first adhesive member 152, the fourth adhesive member 156 may absorb the impact and protect the fingerprint sensor 140. When the thickness of the fourth adhesive member 156 is thicker than the thickness of the first adhesive member 152, the fourth adhesive member 156 may absorb the impact and protect the fingerprint sensor 140.

The fingerprint sensor 140 may be configured to turn on the fingerprint sensor 140 when the pressure input through the pressure sensor 190 is equal to or greater than a predetermined threshold value. That is, the pressure sensor 190 may be configured to control the power of the fingerprint sensor 140. In other words, the power consumption of the fingerprint sensor 140 may be relatively higher than that of the pressure sensor 190. Therefore, the stand-by power or the power consumption of the fingerprint sensor 140 can be reduced by using the pressure sensor 190.

Figure 40A:
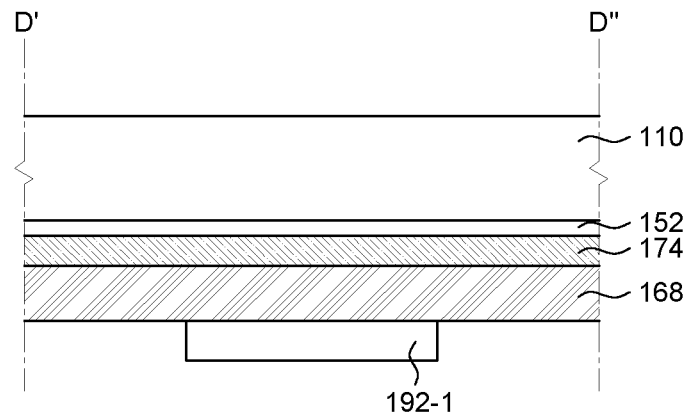
FIGS. 40A, 40B, and 40C are cross-sectional views schematically illustrating a cross section C'-C" corresponding to a fingerprint recognition area of a display device including an electroluminescence display panel capable of providing a fingerprint recognition function, a pressure sensing function, and a speaker function according to the other embodiment of the present disclosure.
Figure 41A:
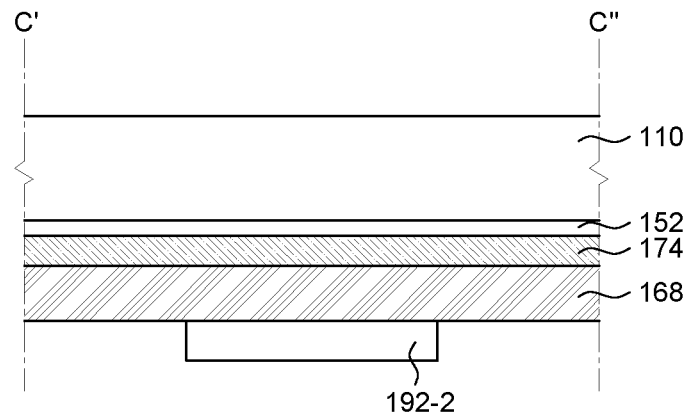
FIGS. 41A, 41B, and 41C are cross-sectional views schematically illustrating a cross section D'-D" corresponding to a fingerprint recognition area of a display device including an electroluminescence display panel capable of providing a fingerprint recognition function, a pressure sensing function, and a speaker function according to the other embodiment of the present disclosure.

FIG. 40A and FIG. 41A are cross-sectional views schematically illustrating cross section C'-C" and D'-D" corresponding to fingerprint recognition areas of a display device including an electroluminescence display panel capable of providing a fingerprint recognition function, a pressure sensing function, and a speaker function according to the other embodiment of the present disclosure.

Redundant features of the display device 3300A according to the other embodiment of the present disclosure and the display devices as illustrated in FIG. 1 to FIG. 39A according to the other embodiments of the present disclosure may be omitted merely for the sake of convenience of explanation.

A display device 3300A according to the other embodiment of the present disclosure may include an electroluminescence display panel 110 including a display area AA configured to recognize a fingerprint, a fingerprint sensor 140 positioned in the fingerprint recognition area FDA and a film-type speaker 192-1 provided in the first area SPK1 of the electroluminescence display panel 110. However, the present disclosure is not limited thereto. Further, another film-type speaker 192-2 may be provided in the second area SPK2 of the electroluminescence display panel 110. That is, a plurality of film-type speakers may be provided. The light-shield support substrate 174 may be positioned the electroluminescence display panel 110 and the fingerprint sensor 140 and may be positioned between the electroluminescence display panel 110 and the film-type speakers 192-1, 192-2.

The electroluminescence display panel 110 of the display device 3300A may include a substrate configured to be an output path of the ultrasonic transmission and reception channel of the fingerprint sensor 140 and the film type speakers 192-1, 192-2, a transistor on the substrate, an electroluminescence element on the transistor, and an encapsulation on the electroluminescent element. Further, the substrate of the electroluminescence display panel 110 may be configured to have a flexible characteristic to transmit pressure of the user's finger.

A display device 3300A may include an electroluminescence display panel 110 configured to output sound and to display an image, a fingerprint sensor 140 configured to enable fingerprint recognition using an ultrasonic method through the electroluminescence display panel 110, and a film type speaker 192-1, 192-2 under the rear side of the fingerprint sensor 140.

As an example, a plurality of film-type speakers 192-1, 192-2 may be composed of a piezoelectric speaker and may be configured to include an actuator of a piezoelectric element. That is, the film-type speaker may be a piezo speaker including a piezoelectric element. That is, the audible frequency vibration output from the speaker may vibrate the electroluminescence display panel 110 bonded to the film-type speakers 192-1 and 192-2, and by the vibration of the electroluminescence display panel 110, sound may be provided to the user.

The cushion member 168 may be positioned under the rear side of the light-shield support substrate 174 and may be configured to surround the fingerprint sensor 140. The cushion member 168 may be positioned between the film-type speaker and the electroluminescence display panel 110, and may be configured to transmit sound in a band of 20 KHz or less while absorbing ultrasonic waves in a band of 10 MHz or more.

At least one film-type speaker of the plurality of film-type speakers 192-1, 192-2 may be overlapped with the cushion member 168. At least one film-type speaker of the plurality of film-type speakers 192-1, 192-2 may be overlapped with the fingerprint sensor 140. In addition, the cushion member 168 may be removed according to the output characteristics of the frequency band of the film-type speaker. In addition, the cushion member may be a foam tape, and the cushion member can relatively absorb the sound of the high frequency band relative to the low frequency band. Therefore, when the output of the high-frequency band of the film-type speaker is insufficient, the cushion member of the region where the corresponding film-type speaker is arranged may be removed.

The film-type speaker may be configured to output sound in the direction toward the electroluminescence display panel 110. However, the present disclosure is not limited thereto, and it may be configured to output sound in the opposite direction to the electroluminescence display panel 110, or to output sound in both directions.

The plurality of film-type speakers 192-1, 192-2 may be at least two or more, and each of the film-type speakers may be spaced apart from each other under the electroluminescence display panel 110.

In some embodiments, at the rear surface of the cushion member, a metallic diaphragm for amplifying the output of the film-type speaker may be provided. The film-type speaker can be configured to output sound through a metallic diaphragm and a fingerprint sensor.

In some embodiments, the display device may include a plurality of pixels on a flexible substrate, a cushion member, under the flexible substrate, including at least one opening, a film-type speaker, under the cushion member, adhered to the periphery of the at least one opening to output sound, and a fingerprint sensor between the film-type speaker and the flexible substrate. In this case, the film-type speaker (e.g., piezo speaker) may be configured to transmit sound through the fingerprint sensor.

In some embodiments, a display device may be positioned between a film-type speaker and a cushion member. Further, a heat dissipation member configured to dissipate heat of the film-type speaker and the fingerprint sensor may be included.

Figure 39B:
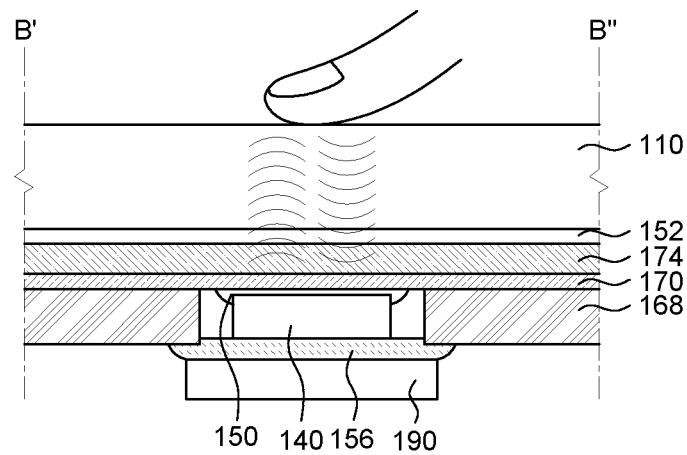
Figure 40B:
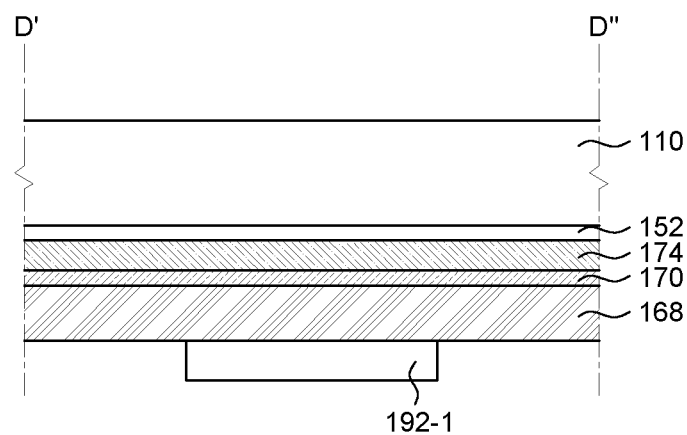
Figure 41B:
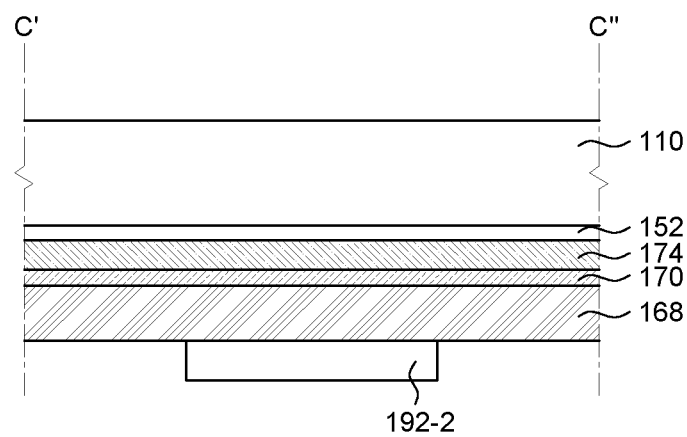

FIG. 39B, FIG. 40B and FIG. 41B are cross-sectional views schematically illustrating cross section B'-B", C'-C" and D'-D" corresponding to a fingerprint recognition area of a display device including an electroluminescence display panel capable of providing a fingerprint recognition function, a pressure sensing function, and a speaker function according to the other embodiment of the present disclosure.

Redundant features of the display device 3300B according to the other embodiment of the present disclosure and the display devices as illustrated in FIG. 1 to FIG. 39A, FIG. 40A and FIG. 41A, according to the other embodiments of the present disclosure may be omitted merely for the sake of convenience of explanation.

Referring to FIG. 39B, FIG. 40B and FIG. 41B, a display device 3300B according to the other embodiment of the present disclosure may include an EMI shield member 170 disposed between an electroluminescence display panel 110 and a cushion member 168. Specifically, the EMI shield member 170 may be disposed between a light-shield support substrate 174 and the cushion member 168.

The EMI shield member 170 may be made of a conductive material. For example, the EMI shield member 170 may comprise metallic particles or may be a metal foil. The EMI shield member 170 may be coated directly at the rear side of the light-shield support substrate 174 or may be bonded together through a separate bonding member. The EMI shield member 170 may be a metal layer, for example, including copper (cu) and may be configured to shield external light transmitted through the electroluminescence display panel 110. In addition, the EMI shield member 170 may be a conductive ink. The EMI shield member 170 may be coated or printed directly under the rear side of the light-shield support substrate 174. In addition, the EMI shield member 170 may be a thin metal film. The EMI shield member 170 may be deposited on the light-shield support substrate 174.

Accordingly, when the EMI shield member 170 is formed directly on the light-shield support substrate 174, since an adhesive member is unnecessary, an additional adhesive member may not be required even if the EMI shield member 170 is added. Therefore, it is possible to improve the image quality of the electroluminescence display panel 110 and the fingerprint recognition sensitivity of the fingerprint sensor 140 while maintaining the signal sensitivity of the fingerprint sensor 140.

Referring to FIG. 39B, the EMI shield member 170 may be configured to shield at least a region where the fingerprint sensor 140 and the electroluminescence display panel 110 are overlapped. For example, the EMI shield member 170 may be configured to shield at least the fingerprint recognition area FDA. However, the present disclosure is not limited thereto. Further, the EMI shield member 170 may be configured to shield the fingerprint recognition area FDA and at least a portion of the display area AA. That is, the EMI shield member 170 may be configured to shield at least the electromagnetic interference noise between the electroluminescence display panel 110 and the fingerprint sensor 140 by shielding at least the fingerprint recognition area FDA.

In addition, referring to FIG. 40B and FIG. 41B, the EMI shield member 170 may be configured to shield at least a region where a plurality of film-type speakers 192-1 and 192-2 and the electroluminescence display panel 110 are overlapped. For example, the EMI shield member 170 may be configured to shield at least a first area SPK1 and a second area SPK2 of the electroluminescence display panel 110. However, the present disclosure is not limited thereto. Further, the EMI shield member 170 may be configured to shield the first area SPK1 and the second area SPK2 of the electroluminescence display panel 110 and at least a portion of the display area AA. That is, the EMI shield member 170 may be configured to shield at least the electromagnetic interference noise between the electroluminescence display panel 110 and the plurality of film-type speakers 192-1 and 192-2 by shielding at least the first area SPK1 and the second area SPK2 of the electroluminescence display panel 110.

Therefore, the deterioration in image quality of the electroluminescence display panel 110 due to the electromagnetic interference generated by the operations of the fingerprint sensor 140 of the ultrasonic type and the film-type speakers 192-1 and 192-2 which are piezoelectric speakers can be suppressed, but also, at the same time, the deterioration in fingerprint recognition sensitivity of the fingerprint sensor 140 due to the electromagnetic interference of the electroluminescence display panel 110 can be suppressed.

Figure 39C:
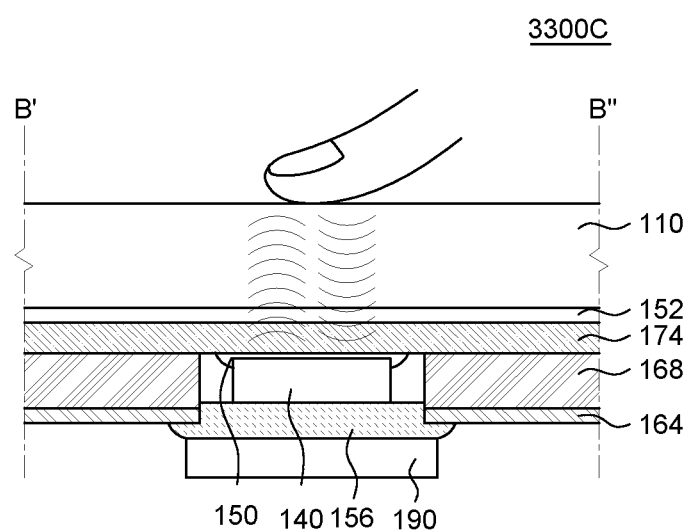
Figure 40C:
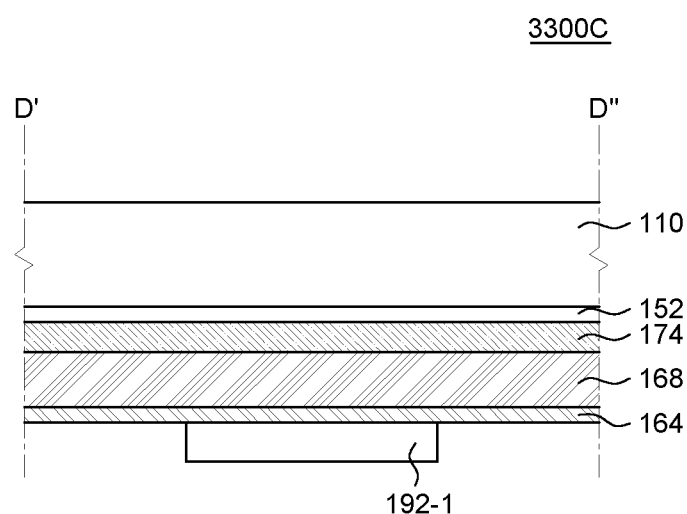
Figure 41C:
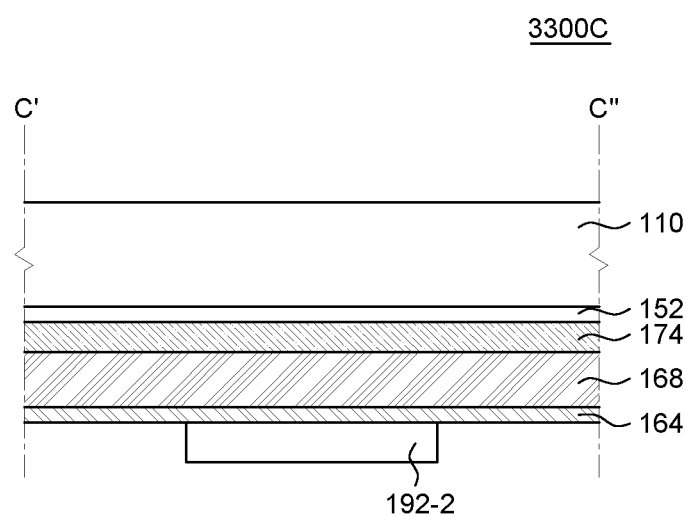

FIG. 39C, FIG. 40C and FIG. 41C are cross-sectional views schematically illustrating cross section B'-B", C'-C" and D'-D" corresponding to a fingerprint recognition area of a display device including an electroluminescence display panel capable of providing a fingerprint recognition function, a pressure sensing function, and a speaker function according to the other embodiment of the present disclosure.

Redundant features of the display device 3300C according to the other embodiment of the present disclosure and the display devices as illustrated in FIG. 1 to FIG. 39A, FIG. 40A and FIG. 41A, according to the other embodiments of the present disclosure may be omitted merely for the sake of convenience of explanation.

Referring to FIG. 39C, FIG. 40C and FIG. 41C, the display device 3300C according to the other embodiment of the present disclosure may be configured to include a heat dissipation member 164 disposed under a rear surface of the cushion member 168.

The heat dissipation member 164 may be configured to surround the fingerprint sensor 140 and overlap a portion of the display area AA to perform the function of a heat sink for the electroluminescence display panel 110. For example, the heat dissipation member 164 may be disposed to correspond to an area of the cushion member 168 under the rear surface of the cushion member 168.

The heat dissipation member 164 may be made of a material having a high thermal conductivity. For example, the heat dissipation member 164 may be made of a material such as metal, graphite, and/or graphene. For example, the thickness of the heat dissipation member 164 may be 50 μm to 100 μm. However, the present disclosure is not limited thereto According to the above-described configuration, the temperature deviation between the fingerprint sensor 140 and periphery of the fingerprint sensor 140 can be reduced by the heat dissipation member 164. Therefore, it is possible to reduce the occurrence of image retention due to the attachment of the fingerprint sensor 140.

In addition, when the heat dissipation member 164 is a conductive material, the heat dissipation member 164 can be electrically grounded. However, the present disclosure is not limited thereto.

Referring to FIG. 40C and FIG. 41C, the heat dissipation member 164 may be disposed between the film-type speakers 192-1 and 192-2 and the cushion member 168. Accordingly, the heat dissipation member 164 may be disposed between the electroluminescence display panel 110 and the film type speakers 192-1 and 192-2. The temperature of an area where the film type speakers 192-1 and 192-2 are attached may increase depending on the output of the film type speakers 192-1 and 192-2. If a temperature difference occurs between the area where the film type speakers 192-1 and 192-2 are attached and the area where the film type speakers 192-1 and 192-2 are not attached, a temperature deviation of the electroluminescence display panel 110 may occur and a residual image may appear on the displayed image. That is, the heat dissipation member 164 can reduce the temperature deviation.

Figure 42:
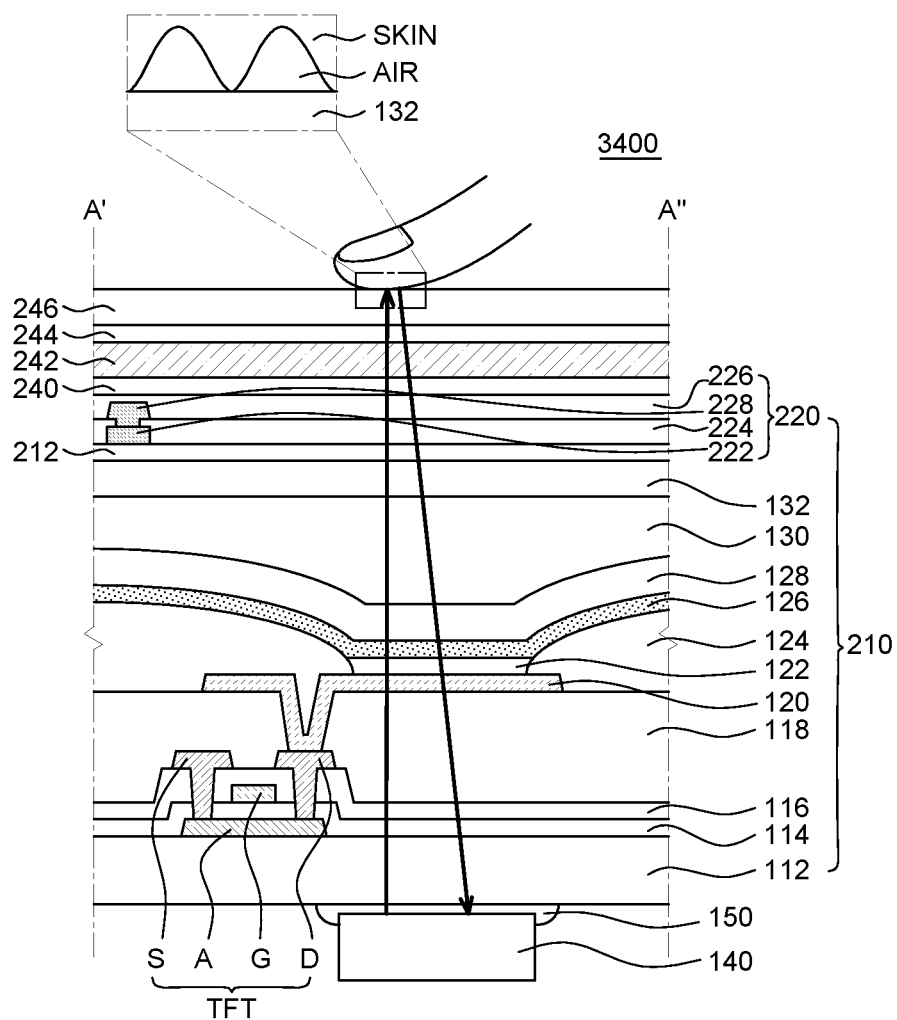
FIG. 42 is a cross-sectional view illustrating a stack structure of an exemplary electroluminescence display panel which can be applied to a cross-section A'-A" of a display device according to the other embodiment of the present disclosure.

FIG. 42 is a cross-sectional view illustrating a stack structure of an exemplary electroluminescence display panel which can be applied to a cross-section A'-A" of a display device according to the other embodiment of the present disclosure.

Redundant features of the display device 3400 according to the other embodiment of the present disclosure and the display device 100 according to an embodiment of the present disclosure may be omitted merely for the sake of convenience of explanation.

The electroluminescence display panel 210 of the display device 3400 according to the other embodiment of the present disclosure may be configured to include an integrated touch panel 220. The integrated touch panel 220 may be formed on the encapsulation unit 128, 130, 132.

The integrated touch panel 220 may be formed by depositing electrode layers 222, 226 and insulating layers 224, 228 on the encapsulation unit 128, 130, 132 during the manufacturing process of the electroluminescence display panel 210. That is, the integrated touch panel 220 does not require an additional substrate for forming a separate touch panel. Thus, the integrated touch panel 220 may be formed on the encapsulation unit 128, 130, 132 of the electroluminescence display panel 210, thereby minimizing the thickness increase and the signal sensitivity degradation of the transmitting and receiving channel for the ultrasonic fingerprint recognition.

By forming the integrated touch panel 220, an unnecessary adhesion process and an unnecessary adhesive member for bonding the conventional touch panel and the electroluminescence display panel can be eliminated. Accordingly, it is possible to remove an adhesive member having a low Young's modulus, which may deteriorate ultrasonic transmission and reception sensitivity, from being positioned between the integrated touch panel 220 and the electroluminescence display panel 210.

Each layer of the integrated touch panel 220 of the electroluminescence display panel 210 according to the other embodiment of the present disclosure may be formed of a material having a high Young's modulus value, for example, the integrated touch panel 220 may be made of a metal material and an inorganic thin film. Thus, the thickness of the ultrasonic transmission and reception channel 220 can be reduced. Therefore, the deterioration of the signal sensitivity of the ultrasonic transmission and reception channel can be minimized. A touch buffer layer 212 may be disposed between the encapsulation unit 132 and the integrated touch panel 220. When the integrated touch panel 220 is formed on the encapsulation unit 128, 130, 132, the touch buffer layer 212 may protect the pad portion formed in the non-display area NA of the electroluminescence display panel 210 from being corroded during an etching process. The thickness of the touch buffer layer 212 may be smaller than the thickness of the second inorganic encapsulation layer 132. The touch buffer layer 212 may be formed of an inorganic film such as silicon nitride (SiNx), silicon oxide (SiOx), or silicon oxynitride (SiON). The thickness of the touch buffer layer 212 may be 0.1 μm to 0.4 μm. However, the present disclosure is not limited thereto, and the touch buffer layer 212 may be removed.

The first touch electrode layer 222 of the integrated touch panel 220 may be formed of a metallic conductive material having a low electrical resistance. However, the present disclosure is not limited thereto. The first touch electrode layer 222 may have a single-layer structure or a multi-layer structure. The first touch electrode layer 222 may be formed in the form of a metal-mesh that has a width narrower than the width of the bank 124. The first touch electrode layer 222 may configure a portion of a driving electrode, a sensing electrode, and/or a bridge electrode of the integrated touch panel 220. For example, the thickness of the first touch electrode layer 222 may be 0.2 μm to 0.5 μm. However, the present disclosure is not limited thereto.

The first touch insulation layer 224 may be disposed on the first touch electrode layer 222. The first touch insulation layer 224 may insulate the first touch electrode layer 222 from the second touch electrode layer 226. The first touch insulation layer 224 may be formed of an inorganic film such as silicon nitride (SiNx), silicon oxide (SiOx), or silicon oxynitride (SiON). For example, the thickness of the first touch insulation layer 224 may be 0.2 μm to 0.5 μm. However, the present disclosure is not limited thereto.

The second touch electrode layer 226 may be disposed on the first touch insulation layer 224. The second touch electrode layer 226 may be preferably made of a metallic conductive material having a low electrical resistance. The second touch electrode layer 226 may have a single-layer structure or a multi-layer structure. The second touch electrode layer 226 may be formed in the form of a metal-mesh that has a width narrower than the width of the bank 124. The second touch electrode layer 226 may configure another portion of the driving electrode, the sensing electrode, and/or the bridge electrode of the integrated touch panel 220. For example, the thickness of the second touch electrode layer 226 may be 0.2 μm to 0.5 μm. However, the present disclosure is not limited thereto.

A portion of the first touch electrode layer 222 and a portion of the second touch electrode layer 226 are electrically connected to each other through a contact hole formed in the first touch insulation layer 224 to form a bridge portion.

The second touch insulation layer 228 may be disposed on the second touch electrode layer 226. The second touch insulation layer 228 may be configured to cover the second touch electrode layer 226. The second touch insulation layer 228 may be formed of an inorganic film such as silicon nitride (SiNx), silicon oxide (SiOx), or silicon oxynitride (SiON), or an organic film such as an acryl material, epoxy material, Parylene-C, Parylene-N, or Parylene-F, or a siloxane-based organic film. For example, the thickness of the second touch insulation layer 228 may be 0.2 μm to 3 μm. However, the present disclosure is not limited thereto.

The second touch insulation layer 228 may prevent corrosion of the second touch electrode layer 226 or may insulate the second touch electrode layer 226. However, the present disclosure is not limited to the second touch insulation layer 228. In some cases, the second touch insulation layer 228 may be omitted.

The integrated touch panel 220 of the electroluminescence display panel 210 according to the other embodiment of the present disclosure may be formed of a capacitive touch panel. The integrated touch panel 220 may include a first touch electrode layer 222 on the encapsulation unit 132, a first touch insulation layer 224 on the first touch electrode layer 222, a second touch electrode 226 on the first touch insulation layer 224, and a second touch insulation layer 228 on the second touch electrode 226. Each of the layers configuring the integrated touch panel 220 may be made of a material having a Young's modulus of at least 1 GPa or more. In addition, the integrated touch panel 220 may have a thickness of 0.8 μm to 4.5 μm to minimize the signal sensitivity reduction of the ultrasonic transmission and reception channel of the fingerprint sensor.

The polarizer 242 may be further included on the integrated touch panel 220. The polarizer 242 may be configured to absorb ambient light reflection. A polarizer adhesive member 240 capable of bonding the polarizer 242 and the integrated touch panel 220 may be applied between the polarizer 242 and the integrated touch panel 220. It is preferable that the polarizer adhesive member 240 is made of an adhesive member having a high Young's modulus in consideration of ultrasonic transmission and reception characteristics. However, the present disclosure is not limited thereto. In addition, it is possible that the polarizer 242 and the polarizer adhesive member 240 are omitted.

A cover 246 may be further included on the polarizer 242. The cover 246 may be configured to protect the electroluminescence display panel 210. The cover 246 is glass in one embodiment. A cover adhesive member 244 capable of bonding the cover 264 and the polarizer 242 may be applied between the cover 246 and the polarizer 242. The cover adhesive member 244 is made of an adhesive member having a high Young's modulus in consideration of ultrasonic transmission and reception characteristics. However, the present disclosure is not limited thereto. In addition, it is possible that the cover 246 and the cover adhesive member 244 are omitted. Further, the Young's modulus of the cover may be 50 GPa or more.

The controller of the fingerprint sensor 140 may generate ultrasonic waves of a suitable frequency to pass through the cover 246 on the front surface of the electroluminescence display panel 110. For example, ultrasonic waves having a frequency of 10 MHz to 15 MHz can be generated and then transmitted and received through the Tx electrodes 141 and the Rx electrodes 143.

In some embodiments, it is also possible to provide various functional layers on the touch panel, such as a protective film, an antistatic film, a polarizing film, an ambient light absorbing film, a protective glass, and the like.

A means implemented to be attachable to the rear surface of the electroluminescence display panel according to various embodiments of the present disclosure can be referred to an arrangement means of the present disclosure. For example, various adhesive members, a light-shield member, a support substrate, a heat dissipation member, a cushion member, an EMI shield member, a light and EMI shield member, a light-shield support substrate, a pressure sensor and the like can be referred to an arrangement means.

Embodiments of the present disclosure can also be described as follows:

A display device according to an embodiment of the present disclosure may include an electroluminescence display panel on a substrate, the electroluminescence display panel including a fingerprint recognition area in a display area including a plurality of pixels on a substrate, an ultrasonic fingerprint sensor under a rear side of the electroluminescence display panel corresponding to the fingerprint recognition area, and a support substrate, between the electroluminescence display panel and the ultrasonic fingerprint sensor, configured to support the electroluminescence display panel and the ultrasonic fingerprint sensor.

A visible light absorption rate of the supporting substrate may be 80% or more.

The substrate may be made of polyimide and the support substrate may be made of polyethylene-terephthalate.

The display device may include an adhesive member positioned between the support substrate and the electroluminescence display panel and configured to adhere the support substrate and the electroluminescence display panel.

The adhesive member may be a pressure-sensitive adhesive having a particular thickness in consideration of ultrasonic transmission and reception characteristics.

A Young's modulus value of the pressure-sensitive adhesive may be 0.02 MPa to 0.4 MPa and a thickness of the pressure-sensitive adhesive may be 5 μm to 15 μm.

The support substrate may include a temperature-reactive material and may be heat-treated at a predetermined threshold temperature or more to change the visible light absorption rate.

A display device according to another embodiment of the present disclosure may include an electroluminescence display panel, a fingerprint sensor disposed below a rear side of the electroluminescence display panel, and a light-shield support substrate positioned between the electroluminescence display panel and the fingerprint sensor and configured to absorb external light that is transmitted through the electroluminescence display panel and reflected by the fingerprint sensor.

A thickness of the light-shield support substrate may be 50 μm to 150 μm and a Young's modulus value of the light-shield support substrate may be 2.5 GPa to 3.5 GPa.

The display device may include an adhesive member positioned between the light-shield support substrate and the fingerprint sensor.

The adhesive member may be applied to correspond an area of the fingerprint sensor.

The adhesive member may be a cured resin having a property of being defoamed.

The adhesive member may be configured to cover a display area of the electroluminescence display panel.

The adhesive member may be a pressure-sensitive adhesive member.

A display device according to the other embodiment of the present disclosure may include an electroluminescence display panel comprising a plurality of pixels on a flexible substrate having a Young's modulus value from 1.5 GPa to 3 GPa, an ultrasonic fingerprint sensor under the electroluminescence display panel 110, and a light-shield support substrate positioned between the electroluminescence display panel and the ultrasonic fingerprint sensor, configured to absorb at least a portion of external light pass through the electroluminescence display panel and configured to reduce a flatness degradation of the electroluminescence display panel due to a stress exerted by an adhesive member bonded with the ultrasonic fingerprint sensor.

The electroluminescence display panel may include a transistor on the flexible substrate, an electroluminescence element on the transistor, and an encapsulation unit on the electroluminescence element, wherein an ultrasonic wave output from the ultrasonic fingerprint sensor is configured to pass through the electroluminescence display panel.

The support substrate may be configured to support a display area of the electroluminescence display panel and a non-display area surrounding a periphery of the display area AA.

The encapsulation unit may be configured to include at least two inorganic encapsulation layers having a Young's modulus value from 70 GPa to 300 GPa.

A path between the ultrasonic fingerprint sensor and the electroluminescence display panel may be configured to be free of a gap and a space capable of reducing the ultrasonic wave.

A frequency of the ultrasonic wave of the ultrasonic fingerprint sensor may be 10 MHz or more.

Embodiments of the present disclosure may disclose various structures and elements enabling a user's fingerprint recognition by contacting a user's finger on a display area of a display device with an ultrasonic fingerprint sensor, a pressure sensor, and/or a film-type speaker attached to the electroluminescence display panel. The various elements of the present disclosure may also be used for solving various problems that may arise when providing fingerprint recognition, pressure recognition and/or audio function. For example, disclosed elements of the present disclosure may be configured to improve above-described problems such as fingerprint recognition speed decrease, fingerprint recognition rate decrease, temperature deviation, image retention, flatness degradation, damage by an impact. Thus, each of the elements of the present disclosure can be selected as needed for solving various.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical spirit of the present disclosure. The scope of the technical spirit of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
    an electroluminescence display panel, the electroluminescence display panel including a display area and a fingerprint recognition area in the display area, the display area including a plurality of pixels;
    an ultrasonic fingerprint sensor under the electroluminescence display panel, the ultrasonic fingerprint sensor overlapping the fingerprint recognition area of the electroluminescence display panel; and
    a support substrate between the electroluminescence display panel and the ultrasonic fingerprint sensor, the support substrate configured to support the electroluminescence display panel and the ultrasonic fingerprint sensor,
    wherein the support substrate includes a temperature-reactive material and is heat-treated at least a threshold temperature to change a visible light absorption rate of the support substrate.

2. The display device of claim 1, wherein the visible light absorption rate of the supporting substrate is at least 80%.

3. The display device of claim 1, wherein the substrate comprises polyimide and the support substrate comprises polyethylene-terephthalate.

4. The display device of claim 3, further comprising:
    an adhesive member between the support substrate and the electroluminescence display panel, the adhesive member adhering together the support substrate and the electroluminescence display panel.

5. The display device of claim 4, wherein the adhesive member is a pressure-sensitive adhesive having a thickness that is based on ultrasonic transmission and reception characteristics of the adhesive member.

6. The display device of claim 4, wherein a Young's modulus of the pressure-sensitive adhesive is 0.02 MPa to 0.4 MPa and a thickness of the pressure-sensitive adhesive is 5 μm to 15 μm.

7. The display device of claim 1, wherein the electroluminescence display panel comprises:
    a substrate;
    a transistor on the substrate;
    an electroluminescence element over the transistor and electrically connected to the transistor;
    an encapsulation unit covering the electroluminescence element; and
    a touch panel on the encapsulation unit.

8. The display device of claim 7, wherein the encapsulation unit comprises:
    a first inorganic encapsulation layer;
    an organic encapsulation layer on the first inorganic encapsulation layer; and
    an second inorganic encapsulation layer on the organic encapsulation layer.

9. The display device of claim 7, wherein the touch panel comprises:
    a first touch electrode layer;
    a first insulation layer on the first touch electrode layer;
    a second touch electrode layer on the first insulation layer; and
    a second insulation layer on the second touch electrode layer.

10. The display device of claim 9, wherein the second touch electrode layer is electrically connected to the first touch electrode layer through a via in the first insulation layer.

11. The display device of claim 7, further comprising:
    a cover layer over the touch panel, the cover layer configured to protect the display device.

12. The display device of claim 11, wherein the cover layer is glass.

13. A display device comprising:
    an electroluminescence display panel;
    a fingerprint sensor disposed under the electroluminescence display panel; and
    a light-shield support substrate between the electroluminescence display panel and the fingerprint sensor, the light-shield support substrate configured to absorb external light that is transmitted through the electroluminescence display panel and reflected by the fingerprint sensor,
    wherein a thickness of the light-shield support substrate is in a range from 50 μm to 150 μm and a Young's modulus of the light-shield support substrate is in a range from 2.5 GPa to 3.5 GPa.

14. The display device of claim 13, further comprising:
    an adhesive member between the light-shield support substrate and the fingerprint sensor, the adhesive member adhering the fingerprint sensor to the light-shield support substrate.

15. The display device of claim 14, wherein the adhesive member is disposed at an area corresponding to the fingerprint sensor.

16. The display device of claim 15, wherein the adhesive member is a defoamed cured resin.

17. The display device of claim 14, wherein the adhesive member is configured to cover a display area of the electroluminescence display panel that emits light.

18. The display device of claim 14, wherein the adhesive member is pressure-sensitive and comprises a Young's modulus in a range from 0.02 MPa to 0.4 MPa.

19. A display device including:
    an electroluminescence display panel comprising a plurality of pixels on a flexible substrate, the flexible substrate having a Young's modulus in a range from 1.5 GPa to 3 GPa;
    an ultrasonic fingerprint sensor under the electroluminescence display panel;
    a cured adhesive member that bonds the ultrasonic fingerprint sensor to the electroluminescence display panel; and a light-shield support substrate positioned between the electroluminescence display panel and the ultrasonic fingerprint sensor, the light-shield support substrate configured to absorb at least a portion of external light that passes through the electroluminescence display panel and configured to reduce a flatness degradation of the electroluminescence display panel due to a stress exerted by the cured adhesive member that bonds the ultrasonic fingerprint sensor to the electroluminescence display panel, wherein the electroluminescence display panel comprises:

a transistor on the flexible substrate, an electroluminescence element on the transistor, and an encapsulation unit on the electroluminescence element, wherein the encapsulation unit comprises at least two inorganic encapsulation layers having a Young's modulus in a range from 70 GPa to 300 GPa.

20. The display device of claim 19, wherein an ultrasonic wave output from the ultrasonic fingerprint sensor is configured to pass through at least a portion of the transistor, a portion of the electroluminescence element, and a portion of the encapsulation unit that overlap the ultrasonic fingerprint sensor.

21. The display device of claim 19, further comprising:

an integrated touch panel on the encapsulation unit.

22. The display device of claim 19, wherein the light-shield support substrate is configured to support a display area of the electroluminescence display panel that displays an image and a non-display area surrounding a periphery of the display area that does not display an image.

23. The display device of claim 19, wherein a path between the ultrasonic fingerprint sensor and the electroluminescence display panel lacks any air gap capable of reducing an ultrasonic wave output by the ultrasonic fingerprint sensor.

24. The display device of claim 23, wherein a frequency of the ultrasonic wave is 10 MHz or more.

* * * * *